United States Patent
Watanabe et al.

(10) Patent No.: US 8,252,672 B2
(45) Date of Patent: Aug. 28, 2012

(54) SILICON CARBIDE SEMICONDUCTOR DEVICE COMPRISING SILICON CARBIDE LAYER AND METHOD OF MANUFACTURING THE SAME

(75) Inventors: Tomokatsu Watanabe, Tokyo (JP); Sunao Aya, Tokyo (JP); Naruhisa Miura, Tokyo (JP); Keiko Sakai, Tokyo (JP); Shohei Yoshida, Tokyo (JP); Toshikazu Tanioka, Tokyo (JP); Yukiyasu Nakao, Tokyo (JP); Yoichiro Tarui, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/267,040

(22) Filed: Nov. 7, 2008

(65) Prior Publication Data
US 2009/0250705 A1    Oct. 8, 2009

(30) Foreign Application Priority Data
Apr. 2, 2008  (JP) ................................. 2008-095693

(51) Int. Cl.
*H01L 21/265* (2006.01)
(52) U.S. Cl. .. 438/518; 438/514; 438/931; 257/E29.104
(58) Field of Classification Search ............... 438/931, 438/514–518; 257/E29.104
See application file for complete search history.

(56) References Cited

U.S. PATENT DOCUMENTS

| | | | | |
|---|---|---|---|---|
| 5,674,765 A | * | 10/1997 | Rottner et al. | 438/506 |
| 5,710,059 A | * | 1/1998 | Rottner | 438/547 |
| 6,096,627 A | * | 8/2000 | Harris et al. | 438/520 |
| 2004/0149993 A1 | * | 8/2004 | McClure et al. | 257/79 |
| 2005/0280004 A1 | * | 12/2005 | Das et al. | 257/77 |
| 2006/0220027 A1 | * | 10/2006 | Takahashi et al. | 257/77 |
| 2007/0158658 A1 | * | 7/2007 | Ryu | 257/77 |
| 2007/0237728 A1 | * | 10/2007 | Verheyen | 424/53 |
| 2008/0146004 A1 | * | 6/2008 | Matocha et al. | 438/478 |

FOREIGN PATENT DOCUMENTS

| | | |
|---|---|---|
| JP | 4-85972 | 3/1992 |
| JP | 2002-289550 | 10/2002 |
| JP | 2003-100657 | 4/2003 |

(Continued)

OTHER PUBLICATIONS

U.S. Appl. No. 12/165,841, filed Jul. 1, 2008, Sawada, et al.

(Continued)

*Primary Examiner* — David Vu
*Assistant Examiner* — Duy T Nguyen
(74) *Attorney, Agent, or Firm* — Oblon, Spivak, McClelland, Maier & Neustadt, L.L.P.

(57) ABSTRACT

A method of manufacturing a silicon carbide semiconductor device having a silicon carbide layer, the method including a step of implanting at least one of Al ions, B ions and Ga ions having an implantation concentration in a range not lower than 1E19 $cm^{-3}$ and not higher than 1E21 $cm^{-3}$ from a main surface of the silicon carbide layer toward the inside of the silicon carbide layer while maintaining the temperature of the silicon carbide layer at 175° C. or higher, to form a p-type impurity layer; and forming a contact electrode whose back surface establishes ohmic contact with a front surface of the p-type impurity layer on the front surface of the p-type impurity layer.

6 Claims, 33 Drawing Sheets

FOREIGN PATENT DOCUMENTS

| | | | |
|---|---|---|---|
| JP | 2005-033030 | | 2/2005 |
| JP | 2007-66959 | | 3/2007 |
| JP | 2007066959 | * | 3/2007 |
| JP | 2007-227655 | | 9/2007 |
| JP | 2007227655 A | * | 9/2007 |

OTHER PUBLICATIONS

U.S. Appl. No. 12/621,963, filed Nov. 19, 2009, Tarui.

U.S. Appl. No. 12/627,403, filed Nov. 30, 2009, Tarui.

U.S. Appl. No. 13/164,430, filed Jun. 20, 2011, Tarui.

Office Action issued Jun. 14, 2011, in Japanese Patent Application No. 2008-095693 with partial English translation.

Japanese Information Statement issued Feb. 29, 2012, in Patent Application No. 2008-95693 (with partial English-language translation).

Japanese Information Statement issued Feb. 27, 2012, in Patent Application No. 2010-143030 (with partial English-language translation).

Yuuki Negoro, et al., "High-Voltage SiC pn Diodes with Avalanche Breakdown Fabricated by Aluminum or Boron Ion Implantation", Materials Science Forum, vols. 389-393, 2002, pp. 1273-1276.

R. Kakanakov, et al., "Reliable Ohmic Contacts to LPE p-Type 4H-SiC for High-Power p-n Diode", Materials Science Forum, vols. 389-393, 2002, pp. 917-920.

H. Tanaka, et al., "Electrical Characteristics of Al Ion-Implanted 4H-SiC", Materials Science Forum, vols. 389-393, 2002, pp. 803-806.

* cited by examiner

F I G . 1
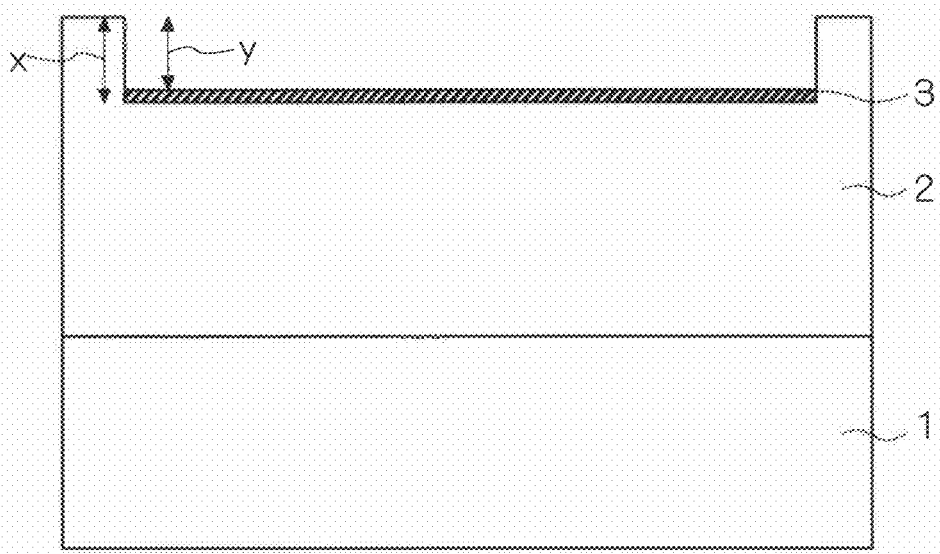
F I G . 2

F I G . 5
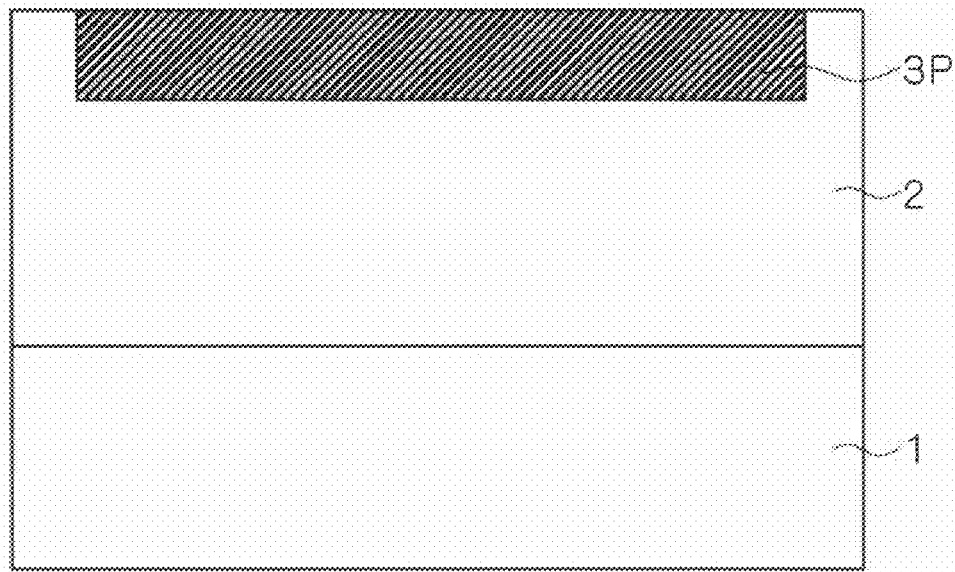
F I G . 6
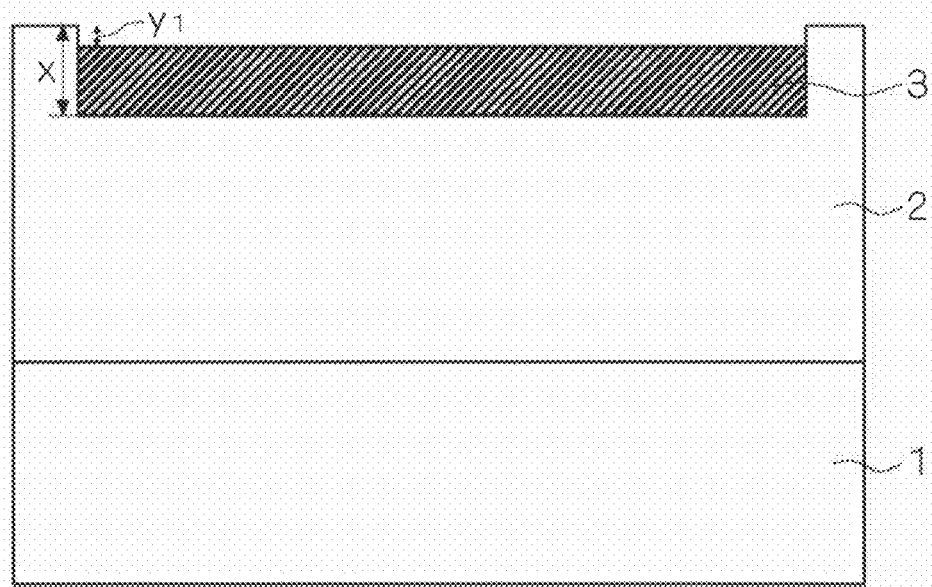

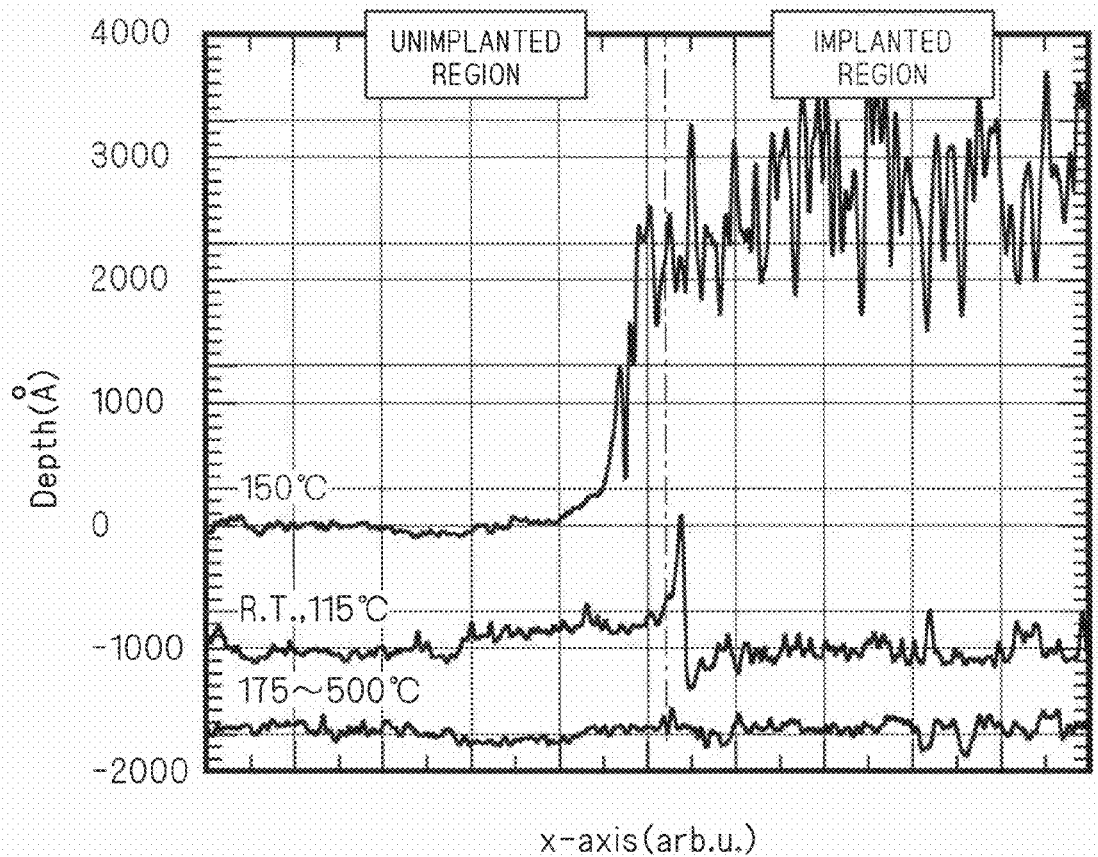

F I G . 1 1
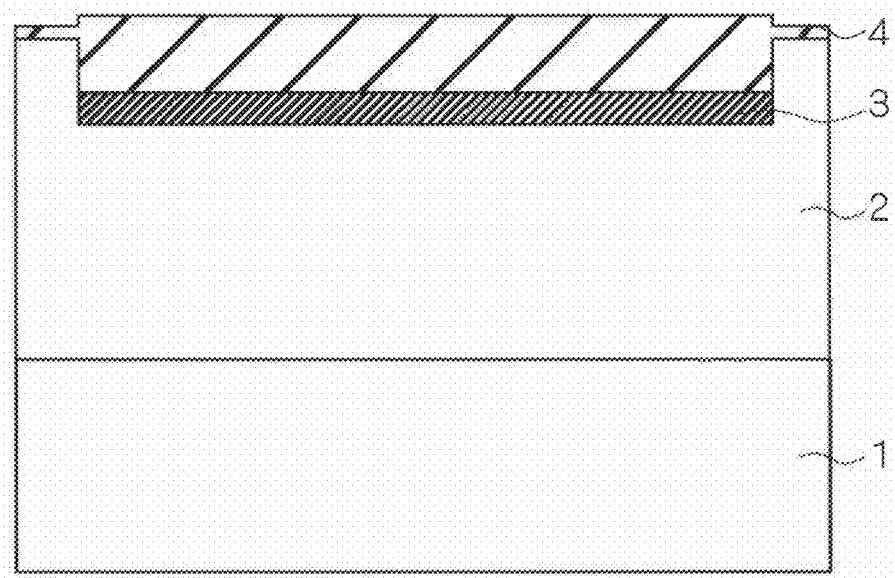
F I G . 1 2
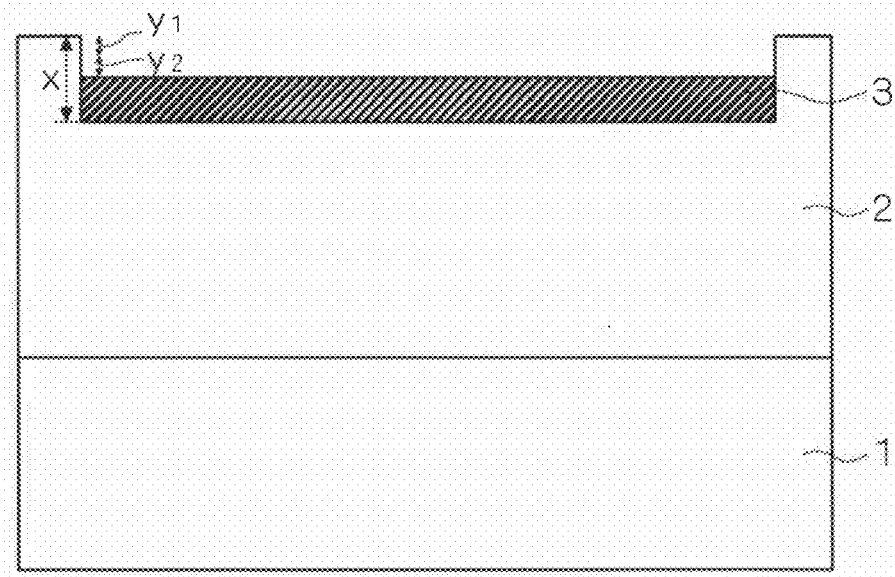

F I G . 3 3
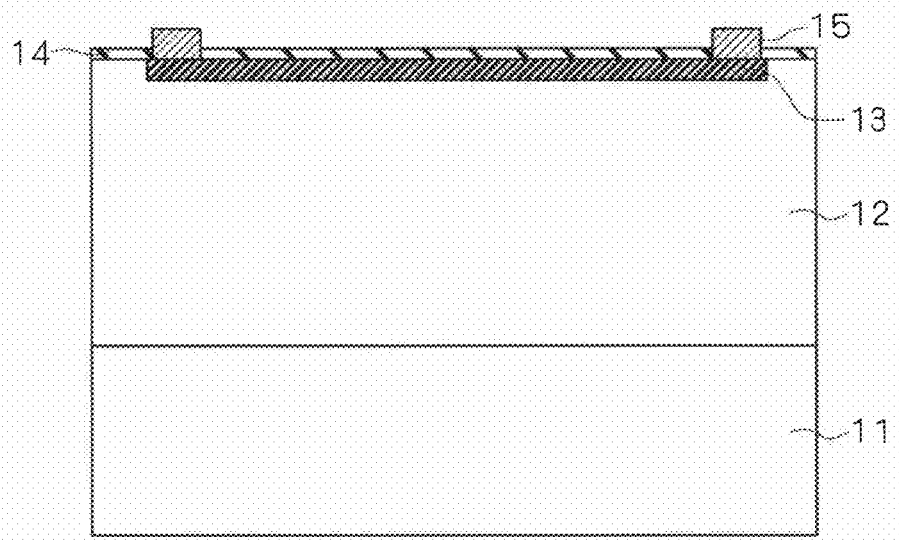
F I G . 3 4
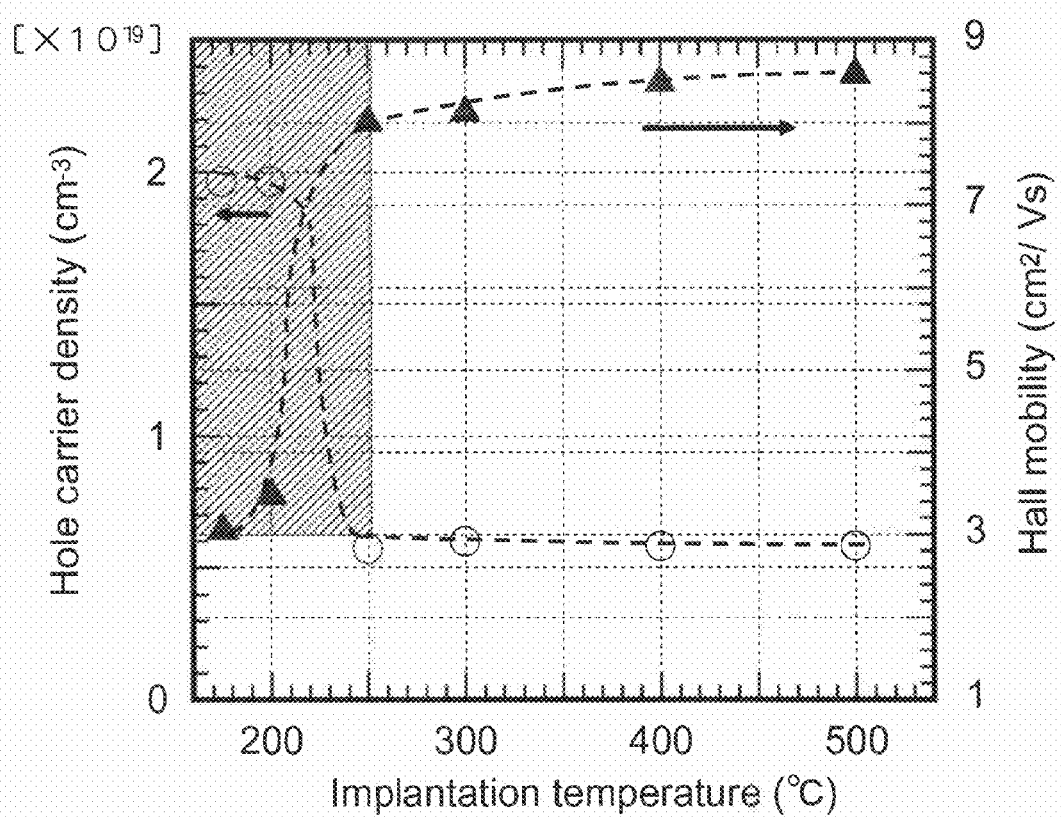

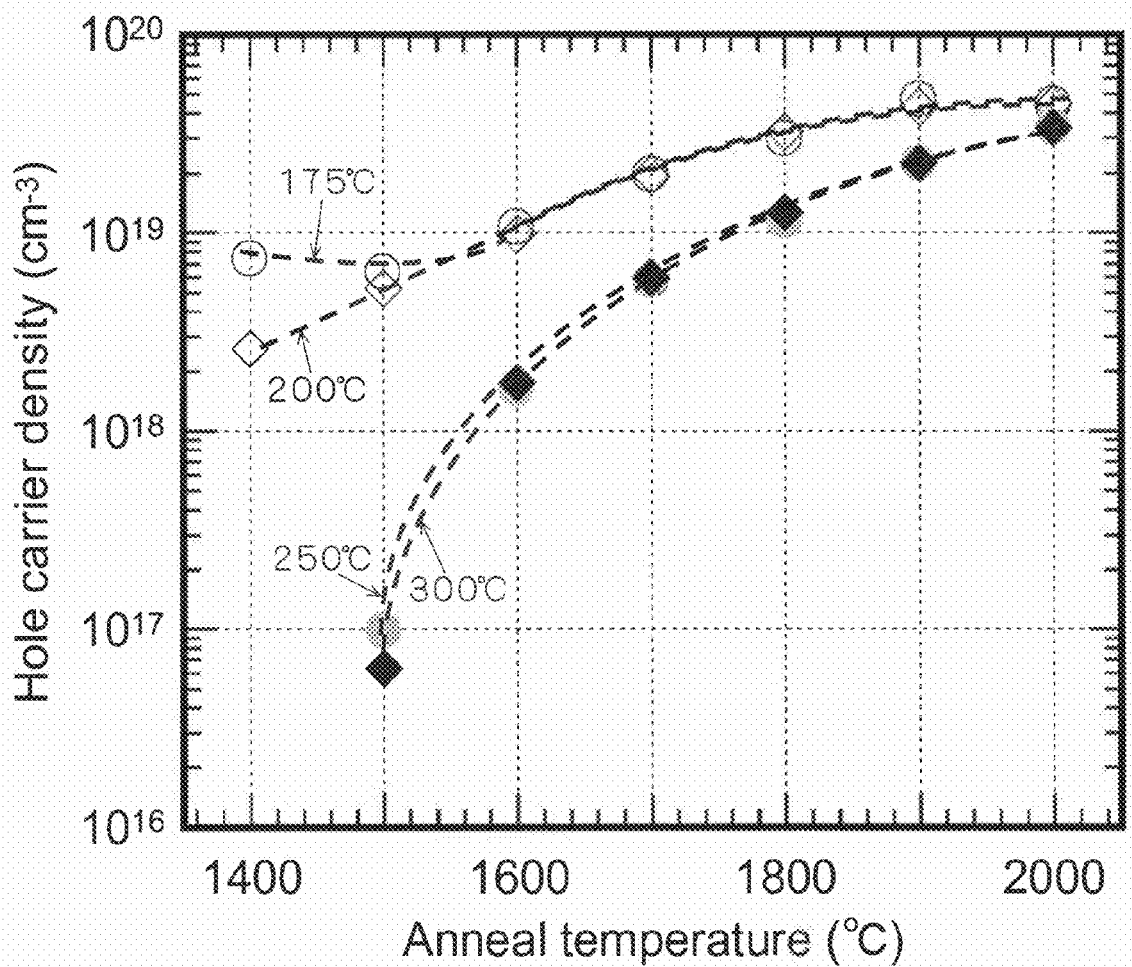

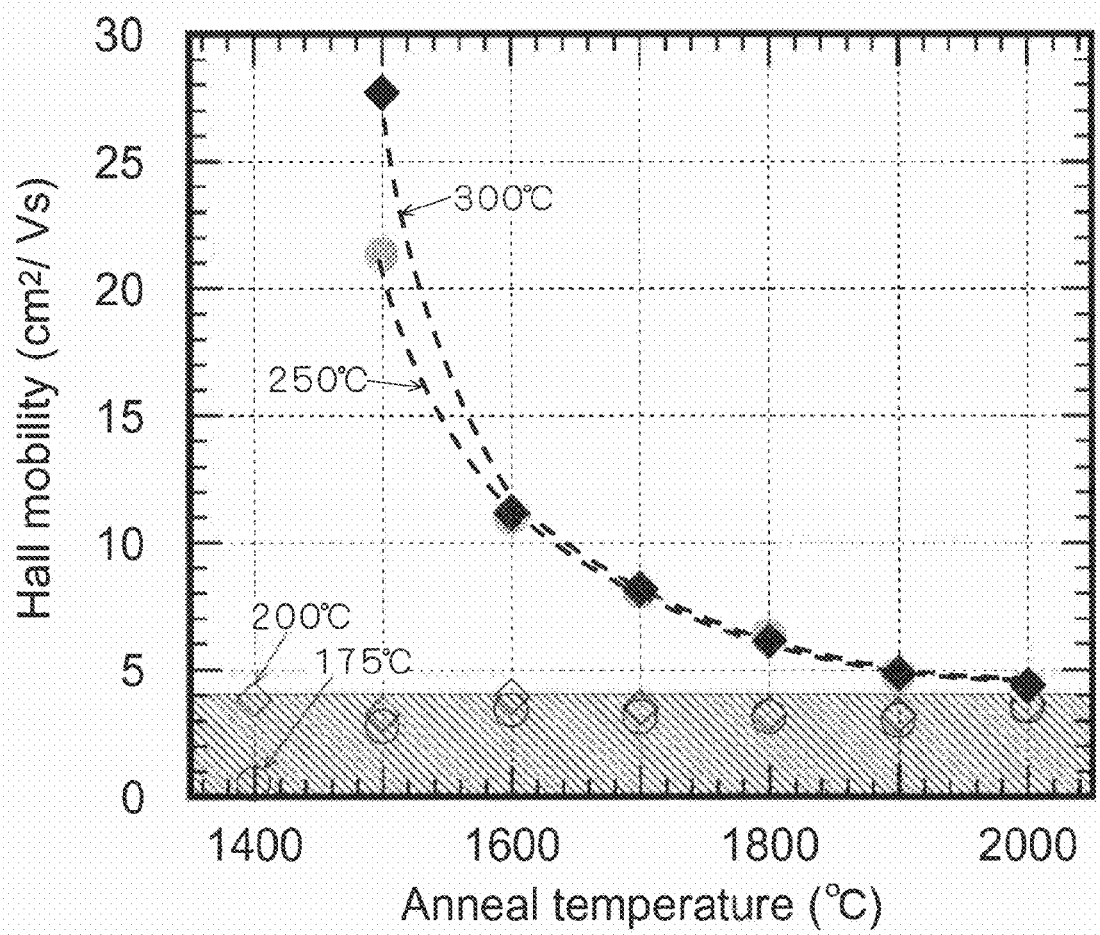

F I G . 3 7
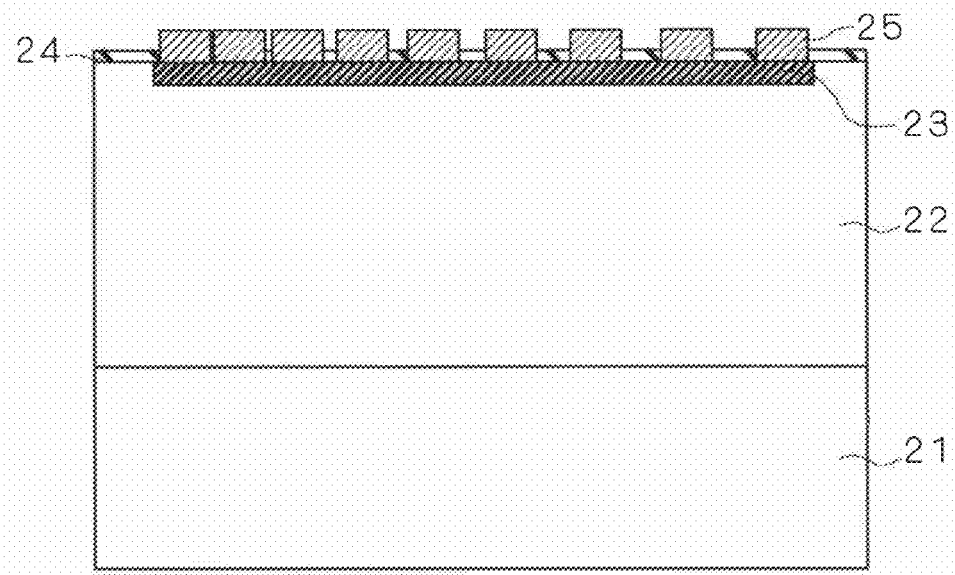
F I G . 3 8
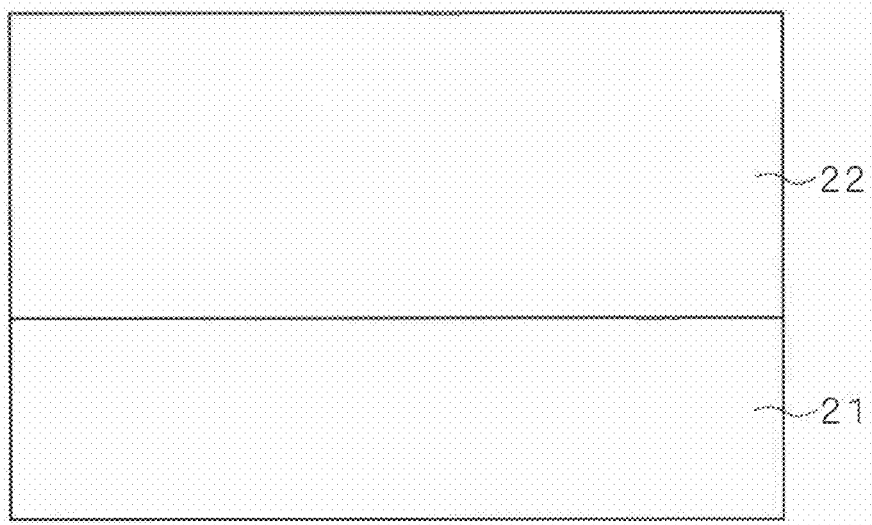

F I G . 4 8
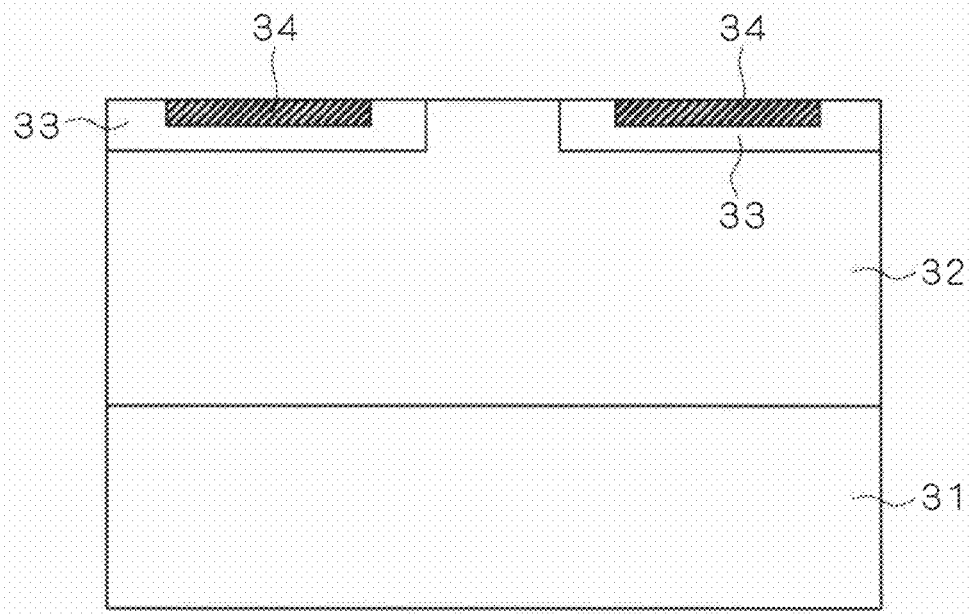
F I G . 4 9
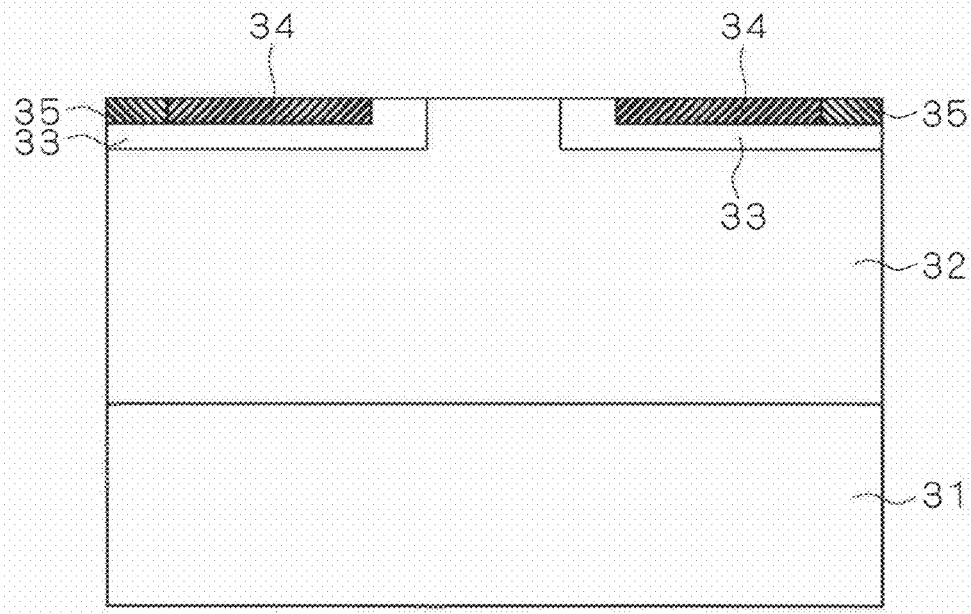

SILICON CARBIDE SEMICONDUCTOR DEVICE COMPRISING SILICON CARBIDE LAYER AND METHOD OF MANUFACTURING THE SAME

BACKGROUND OF THE INVENTION

1. Field of the Invention

The present invention relates to a technique for manufacturing a silicon carbide semiconductor device.

2. Description of the Background Art

In order to break the limitation of properties of power devices using silicon, development of power devices using silicon carbide has been made. Especially, p-type ohmic contact of low resistivity is an essential element for a silicon carbide semiconductor device and in order to achieve it, it is very important to establish a technique for forming a high-concentration p++ layer.

In a method of forming a p-type base ohmic contact shown in Japanese Patent Application Laid Open Gazette No. 2007-66959 (Patent Document 1), for forming a p++ layer for contact, ion implantation (Al, B, Ga) is performed under an atmosphere of the temperature of 400° C. or higher and this makes it possible to avoid any process failure occurring in manufacture of silicon carbide MOSFETs.

Further, Japanese Patent Application Laid Open Gazette No. 2007-227655 (Patent Document 2) discloses that silicon carbide is heated up to 150° C. to 400° C. during high-concentration ion implantation and this suppresses crystal degradation due to the ion implantation.

Since the silicon carbide has better property value than silicon, the silicon carbide is expected as a semiconductor material for next-generation power devices. A p-type base ohmic contact of a MOSFET using silicon carbide consists of a p++ layer formed by implantation of high-concentration ions (Al, B, Ga) having a concentration of 1e19 $cm^{-3}$ to 1e21 $cm^{-3}$ and a metal electrode. Since the crystal of the p++ layer is significantly degraded when implantation of such high-concentration ions is performed at room temperature, this causes a process failure in manufacture of devices. Therefore, the method of performing the high-concentration ion implantation at high temperatures to suppress the crystal degradation is used.

On the other hand, in terms of switching loss, avalanche capability and the like of devices, it is desirable that the resistivity of the p-type base ohmic contact should be lower.

In well-known techniques, however, nothing is mentioned on a detailed relation among the temperature for high-concentration ion implantation, the resistivity of a p-type base ohmic contact and the process failure in manufacture of devices.

SUMMARY OF THE INVENTION

The present invention is made on the basis of recognition of the present circumstances, and it is an object of the present invention to establish a technique for manufacturing a silicon carbide semiconductor device including a low-resistance p-type ohmic contact, without any process failure occurring in manufacture of devices.

The present invention is intended for a method of manufacturing a silicon carbide semiconductor device comprising a silicon carbide layer. According to a main aspect of the present invention, the method includes a step of implanting any one type of ions among Al ions, B ions and Ga ions having an implantation concentration in a range not lower than 1E19 $cm^{-3}$ and not higher than 1E21 $cm^{-3}$ from a main surface of the silicon carbide layer toward the inside of the silicon carbide layer while maintaining the temperature of the silicon carbide layer at 175° C. or higher, to form a p-type impurity layer. The method of the present invention further includes a step of forming a contact electrode whose back surface establishes ohmic contact with a front surface of the p-type impurity layer on the front surface of the p-type impurity layer.

The present invention is also intended to establish a technique for manufacturing a silicon carbide semiconductor device including a low-resistance p-type base ohmic contact, without any process failure occurring in manufacture of devices.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal section showing a structure of a silicon carbide semiconductor device used to evaluate the effect of a process on a p++ region for silicon carbide p-type base ohmic contact, which is manufactured by a method of manufacturing a silicon carbide semiconductor device in accordance with a first preferred embodiment;

FIGS. 2 to 6 are longitudinal sections each showing part of the method of manufacturing a silicon carbide semiconductor device in accordance with the first preferred embodiment;

FIG. 10 is a graph showing a step profile between implanted and unimplanted regions after activation annealing in the silicon carbide semiconductor device in accordance with the first preferred embodiment;

FIGS. 11 and 12 are longitudinal sections each showing part of the method of manufacturing a silicon carbide semiconductor device in accordance with the first preferred embodiment;

FIGS. 28 to 33 are longitudinal sections each showing part of the method of manufacturing a silicon carbide semiconductor device in accordance with the second preferred embodiment;

FIG. 34 is a graph showing the implantation temperature dependence of the hole carrier density (plot: ○ blank circle) and the Hall mobility (plot: ▲ solid triangle) in the p++ region manufactured by the method of manufacturing a silicon carbide semiconductor device in accordance with the second preferred embodiment;

FIG. 35 is a graph showing the activation anneal temperature dependence and the implantation temperature dependence of the hole carrier density in the p++ region manufactured by the method of manufacturing a silicon carbide semiconductor device in accordance with the second preferred embodiment;

FIG. 36 is a graph showing the activation anneal temperature dependence and the implantation temperature dependence of the Hall mobility in the p++ region manufactured by the method of manufacturing a silicon carbide semiconductor device in accordance with the second preferred embodiment;

FIG. 37 is a longitudinal section showing a structure of a silicon carbide semiconductor device used to evaluate the resistivity of a silicon carbide p-type base ohmic contact by the TLM measurement, which is manufactured by the method of manufacturing a silicon carbide semiconductor device in accordance with a second preferred embodiment;

FIGS. 38 to 43 are longitudinal sections each showing part of the method of manufacturing a silicon carbide semiconductor device in accordance with the second preferred embodiment;

FIGS. 47 to 55 are longitudinal sections each showing part of the method of manufacturing a silicon carbide semiconductor device in accordance with the third preferred embodiment.

DESCRIPTION OF THE PREFERRED EMBODIMENTS

The First Preferred Embodiment

Figure 3:

Detailed discussion will be made below on the effect of a high temperature process on a p++ region for silicon carbide p-type base ohmic contact which is manufactured by a method of manufacturing a silicon carbide semiconductor device in accordance with the first preferred embodiment.

FIG. 1 is a longitudinal section showing a structure of a semiconductor device used to evaluate the effect of a process on the p++ region for silicon carbide p-type base ohmic contact. In FIG. 1, reference numeral 1 represents a silicon carbide substrate, reference numeral 2 represents a silicon carbide epitaxial layer grown on a surface of the silicon carbide substrate 1 and reference numeral 3 represents a p++ region formed on a surface of a step groove of the silicon carbide epitaxial layer 2.

Next, a procedure for evaluating the effect of a process on the p++ region for silicon carbide p-type base ohmic contact 3 in the first preferred embodiment will be discussed with reference to FIGS. 2 to 12. Reference numeral 4 in FIG. 11 represents a thermal oxide film.

First, the silicon carbide epitaxial layer 2 having a film thickness in a range from 1.0 μm to 100 μm is layered on an upper surface of the silicon carbide substrate 1 having an off angle by thermal CVD (Chemical Vapor Deposition) at a temperature of 1500° C. to 1600° C. and an atmospheric pressure of 250 mbar, with carrier gas species of $H_2$ and product gas species consisting of $SiH_4$ (silane) and $C_3H_8$ (propane) (see FIG. 2).

Figure 4:
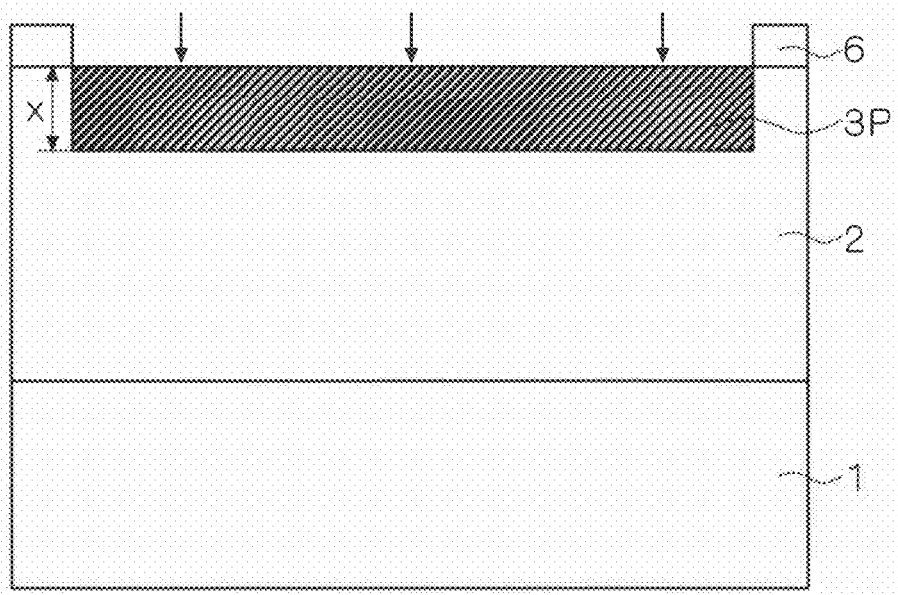

Next, a selective ion implantation mask 6 is formed on an upper surface of the silicon carbide epitaxial layer 2 (see FIG. 3) and then any one type of ions among Al ions, B ions and Ga ions having a concentration of 1e19 $cm^{-3}$ to 1e21 $cm^{-3}$ are implanted into a region in a range from the upper surface of the silicon carbide epitaxial layer 2 to the depth x μm, to form a p++ layer 3P (see FIG. 4). This ion implantation is performed while the silicon carbide member (1+2) is kept at temperatures (hereinafter, referred to also as implantation temperatures or holding temperatures) in a range from the room temperature to 500° C.

After removing the selective ion implantation mask 6 (see FIG. 5), an activation annealing is performed on the silicon carbide member (1+2) including the p++ layer 3P at a temperature in a range from 1400° C. to 2000° C., to form the p++ region 3 (see FIG. 6). The p++ region 3 is etched deeper than an unimplanted region by sublimation of silicon carbide at the high temperature, and as a result, as shown in FIG. 6, a step having a depth of $y_1$ is formed between the unimplanted upper surface of the silicon carbide epitaxial layer 2 and an upper surface of the etched p++ region 3.

Figure 7:
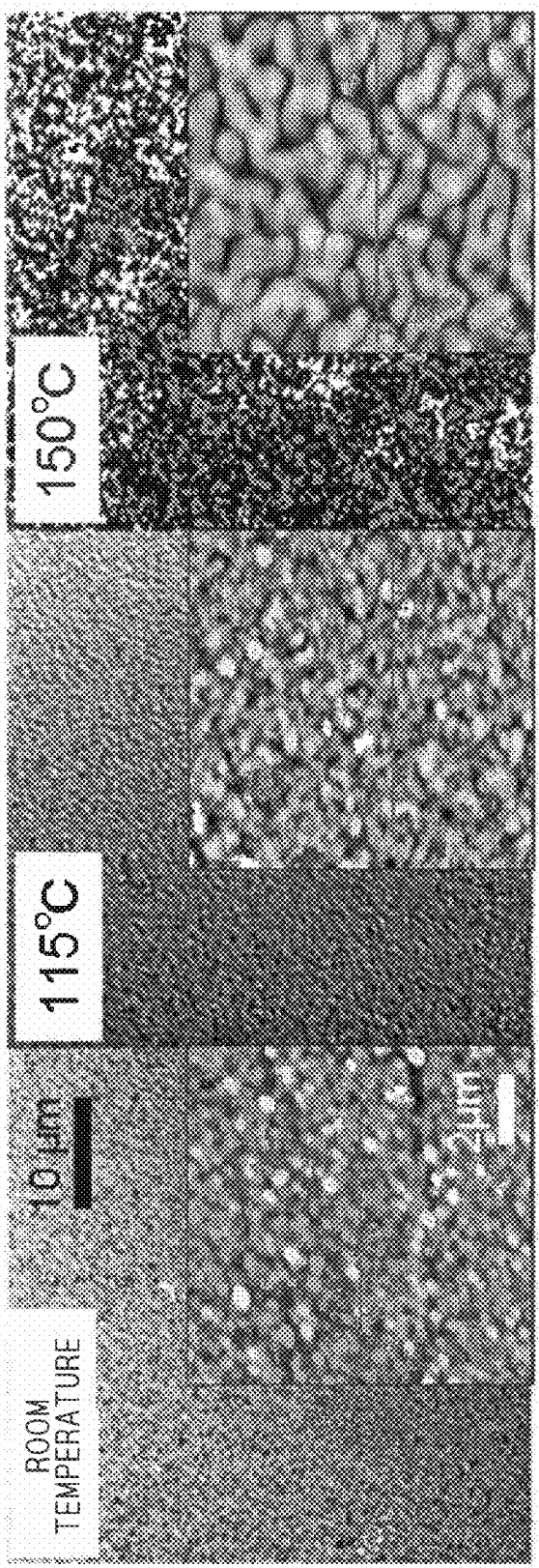
FIGS. 7 to 9 are views each showing a surface morphology of the p++ region after activation annealing in a silicon carbide semiconductor device in accordance with the first preferred embodiment.
Figure 8:
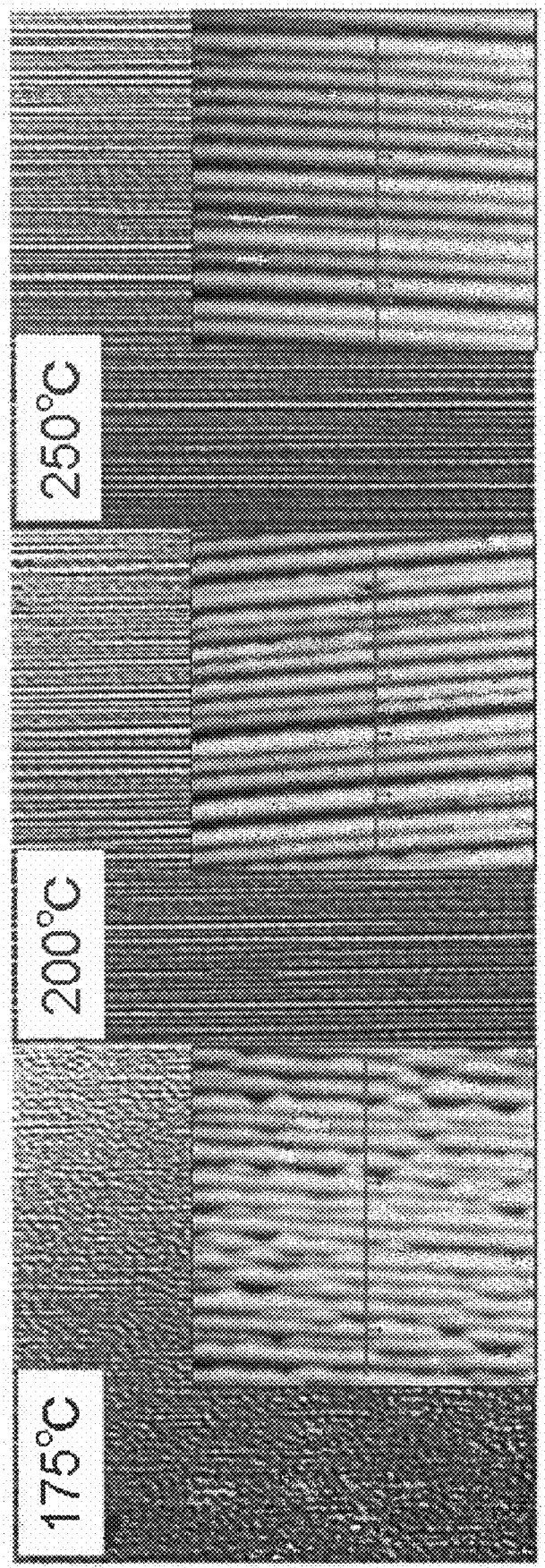
Figure 9:
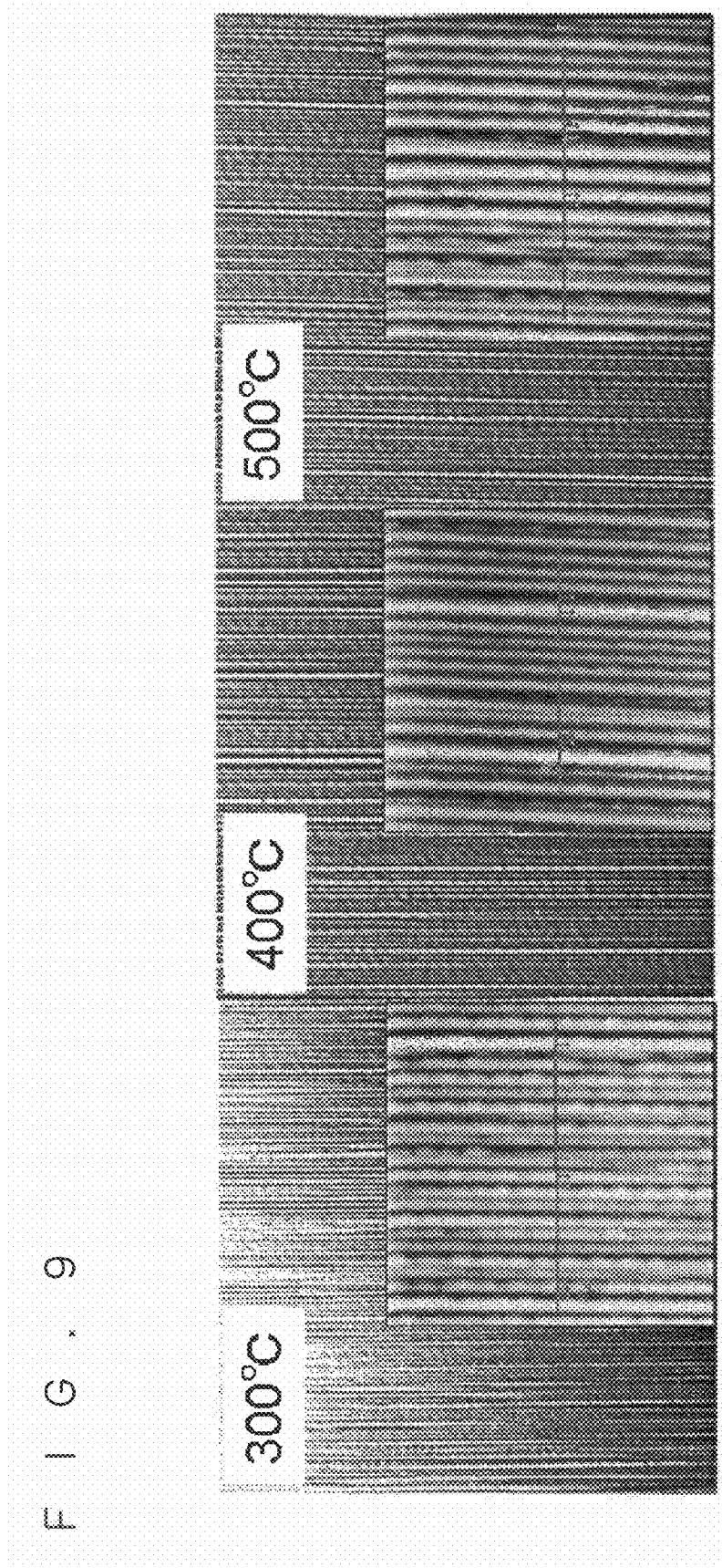

The surface morphologies of the p++ region 3 after the activation annealing are shown in FIGS. 7 to 9. Herein, the implantation depth x is about 0.25 μm and the activation anneal temperature is about 1700° C. Further, the image observation is made by using an optical microscope and an AFM (Atomic Force Microscopy). Random surface roughness is found on surfaces of the p++ regions 3 in the respective samples subjected to the ion implantation at the implantation temperatures of room temperature and 115° C., and the rms (root mean square) obtained by the AFM evaluation is 20 nm to 40 nm. This is caused by the phenomenon that the silicon carbide crystal which is significantly degraded by the high-concentration ion implantation is degenerated into another polycrystal by the activation annealing process. In the sample subjected to the ion implantation at the implantation temperature of 150° C., larger surface roughness is randomly found on the surface of the p++ region 3, and the rms is 300 nm to 500 nm. This is caused by the phenomenon that a polycrystal having a larger particle diameter is grown by the activation annealing. On the other hand, step bunching (its rms is about 50 nm) corresponding to the off angle of the silicon carbide substrate 1 is found in the p++ region 3 in the sample subjected to the ion implantation at the implantation temperature in a range from 175° C. to 500° C., and this means that recovery to the crystal structure before the ion implantation proceeds. In the samples subjected to the ion implantation at the implantation temperature in a range not lower than 175° C. and not higher than 300° C., especially, it is found that the surface of the p++ region 3 includes another surface roughness as well as the surface roughness of step bunching corresponding to the off angle. On the other hand, in the sample subjected to the ion implantation at the implantation temperature of 400° C. or 500° C., the surface of the p++ region 3 includes only the surface roughness of step bunching corresponding to the off angle.

A step profile between the implanted and unimplanted regions after the activation annealing is shown in FIG. 10. In FIG. 10, the horizontal axis x represents the scan direction of a profilometer and the vertical axis represents the relative depth (with the depth of the unimplanted region at the implantation temperature of 150° C. as the reference value of 0, the measurement results of the profilometer are relatively shown). Also in other step profiles between the implanted and unimplanted regions shown hereafter, the definitions of the horizontal and vertical axes are the same as above.

It can be seen from FIG. 10 that there is no difference on etching or sublimation by the activation annealing between the implanted and unimplanted regions in the sample subjected to the ion implantation at the implantation temperature in the range from 175° C. to 500° C. since the step between the regions is not found. In contrast to this, in the sample subjected to the ion implantation at the holding temperature of room temperature or 115° C., the step of about 20 nm to 30 nm is found, and this means that the etching or sublimation of the p++ region 3 is slightly more promoted than that of the unimplanted region at the implantation temperature of room temperature or 115° C. On the other hand, the result of the case where the ion implantation is performed at the implantation temperature of 150° C. shows that the p++ region 3 in the sample has a swollen shape as compared with the unimplanted region and it can be thought that this is probably caused by growth of a polycrystal having a larger particle diameter.

In order to appropriately form the p++ region 3, it is necessary to consider two cases, i.e., (1) the case where the p++ region 3 is swollen more than the unimplanted region and (2) the case where there is some step between the unimplanted region and the implanted region. In the latter case (2), assuming that the initial depth at the time when the Al ions or the like are implanted is x and the depth of the step after the activation annealing is $y_1$ ($y_1$<0), the relation of $|x|>|y_1|$ should be satisfied in FIG. 6.

As to this point, it can be seen from the measurement result of FIG. 10 that the p++ region 3 can be appropriately formed at any implantation temperature (holding temperature) in the manufacture of devices where only the activation annealing process is performed.

Next, the thermal oxide film ($SiO_2$ film) 4 is formed on the upper surfaces of the p++ region 3 and SiC epitaxial layer 2 by thermal oxidation (see FIG. 11). In this case, since the crystal of the p++ region 3 is already degraded significantly by the ion implantation process, the rate of oxidation of the p++ region 3 by the thermal oxidation is higher than that of the unimplanted region. Therefore, as shown in FIG. 11, the p++ region 3 is oxidized inside much deeper than the unimplanted region. After that, the thermal oxide film 4 is removed by hydrofluoric acid, to form such a step as shown in FIG. 12 (having a depth of $|y_1|+|y_2|$).

Figure 13:
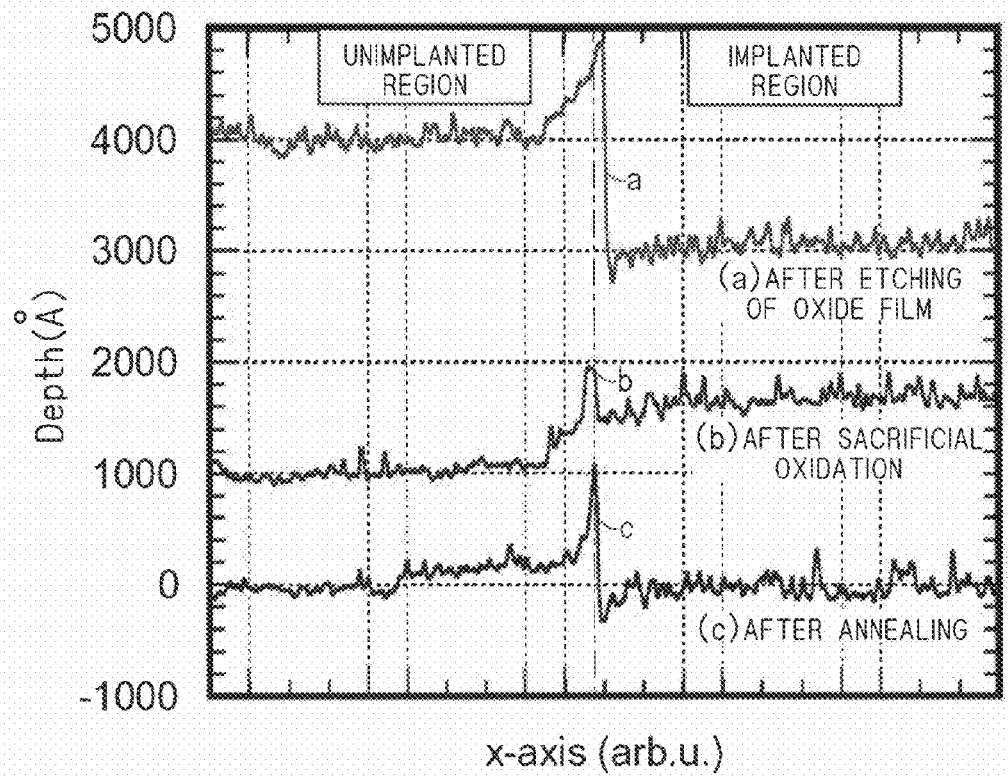
FIG. 13 is a graph showing a step profile (implantation temperature: room temperature or 115° C.) between implanted and unimplanted regions after thermal oxidation and removal of a thermal oxide film in the silicon carbide semiconductor device in accordance with the first preferred embodiment.
Figure 14:
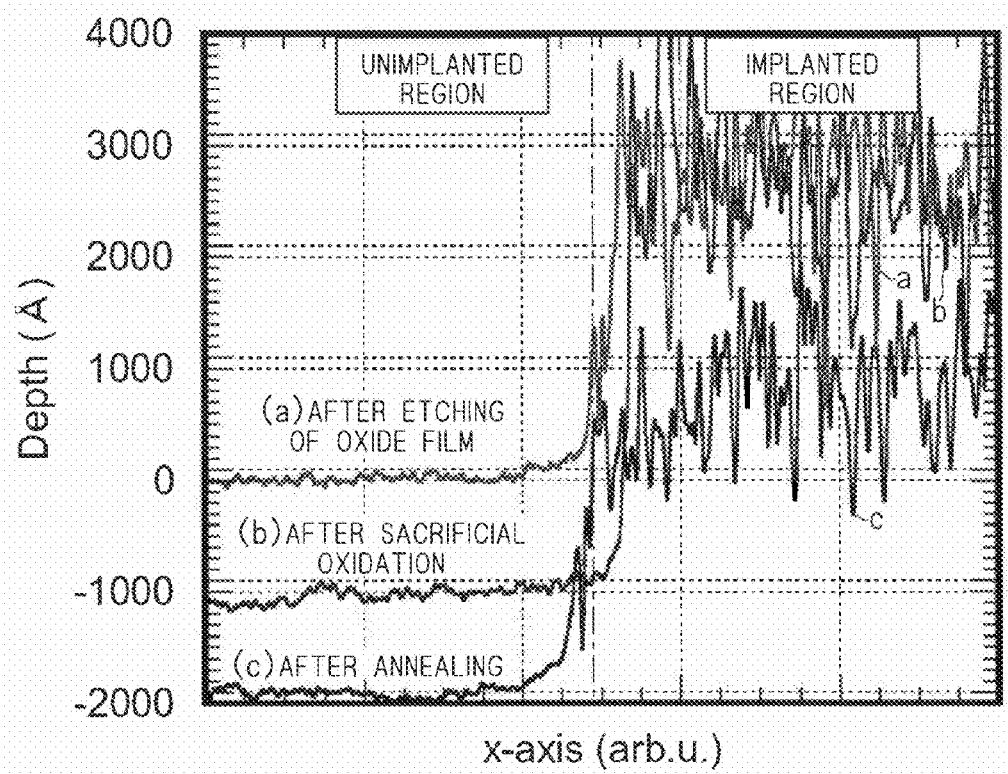
FIG. 14 is a graph showing a step profile (implantation temperature: 150° C.) between implanted and unimplanted regions after thermal oxidation and removal of a thermal oxide film in the silicon carbide semiconductor device in accordance with the first preferred embodiment.
Figure 15:
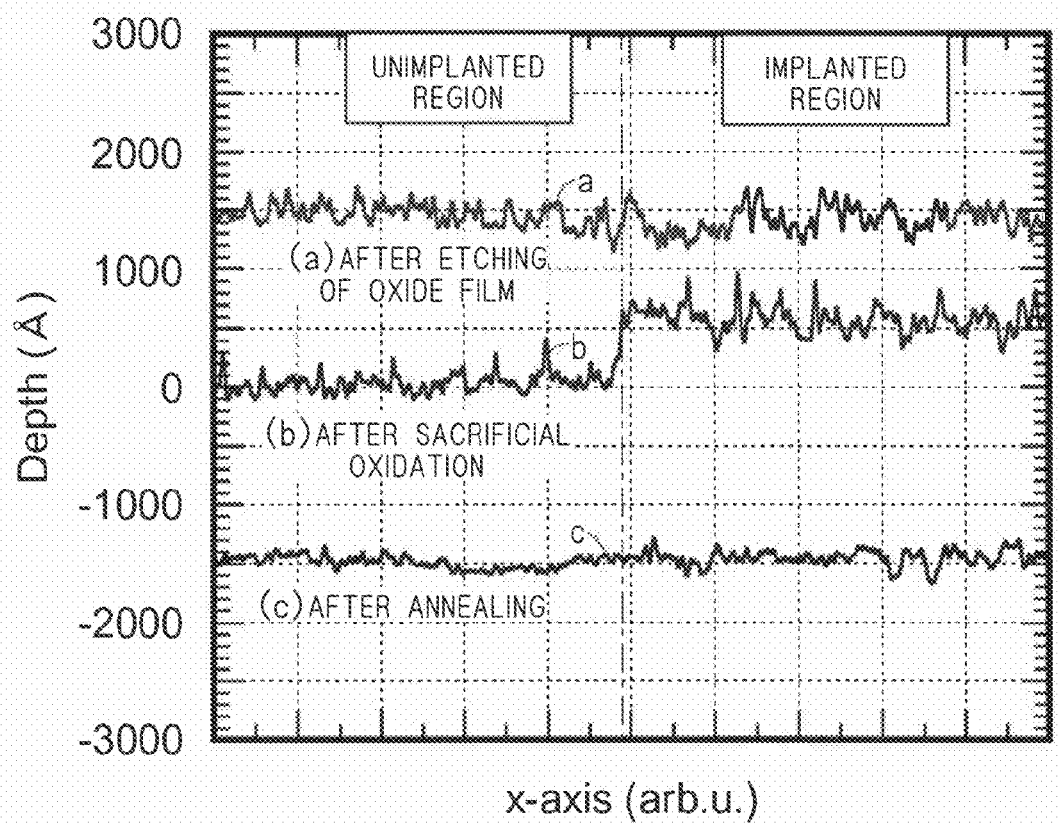
FIG. 15 is a graph showing a step profile (implantation temperature: 175° C. to 500° C.) between implanted and unimplanted regions after thermal oxidation and removal of a thermal oxide film in the silicon carbide semiconductor device in accordance with the first preferred embodiment.

Step profiles between the implanted and unimplanted regions after the thermal oxidation (sacrificial oxidation) and the removal of the thermal oxide film (etching of the oxide film), together with the already-shown step profiles between the implanted and unimplanted regions after the activation annealing, are shown in FIG. 13 (the case at the implantation temperature of room temperature or 115° C.), FIG. 14 (the case at the implantation temperature of 150° C.) and FIG. 15 (the case at the implantation temperature of 175° C. to 500° C.). In all the samples, since the p++ region 3 after the sacrificial oxidation becomes higher than the unimplanted region by about 50 nm, it can be seen that a thicker thermal oxide film is formed on the p++ region 3. On the other hand, in the step profiles between the implanted and unimplanted regions after the removal of the oxide film, it can be seen that the p++ region 3 in the sample subjected to the ion implantation at the implantation temperature of room temperature or 115° C. is thermally oxidized more deeper than the unimplanted region while there is no such difference between the regions in the samples subjected to the ion implantation at the implantation temperature of 150° C. to 500° C. Herein, in order to appropriately form the p++ region 3, the relation of $|x|>(|y_1|+|y_2|)$ should be satisfied. As to this point, the measurement result of FIG. 13 suggests that the process of forming the p++ region 3 by the ion implantation at the implantation temperature not higher than 115° C. can not be applied to a device process requiring three or more thermal oxidation steps in an actual process.

Figure 16:
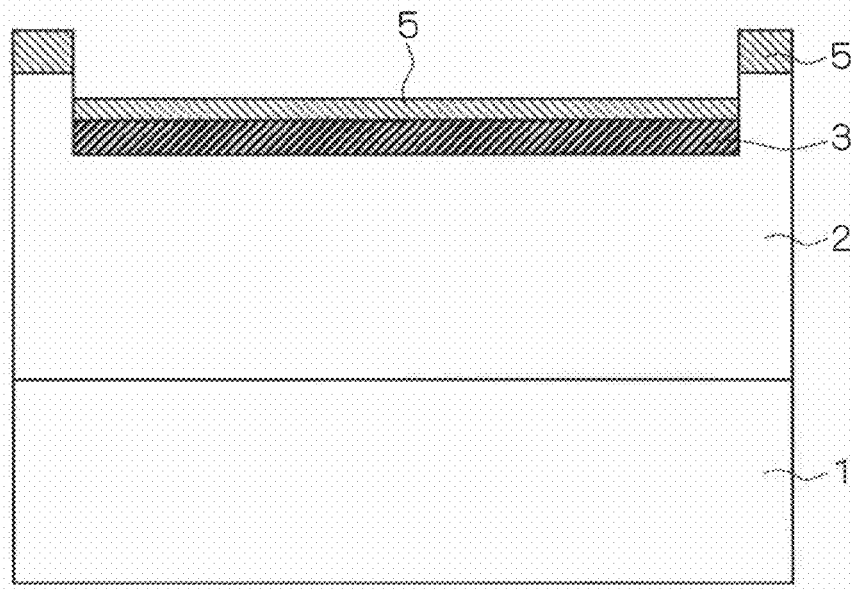
FIGS. 16 and 17 are longitudinal sections each showing part of the method of manufacturing a silicon carbide semiconductor device in accordance with the first preferred embodiment.
Figure 17:
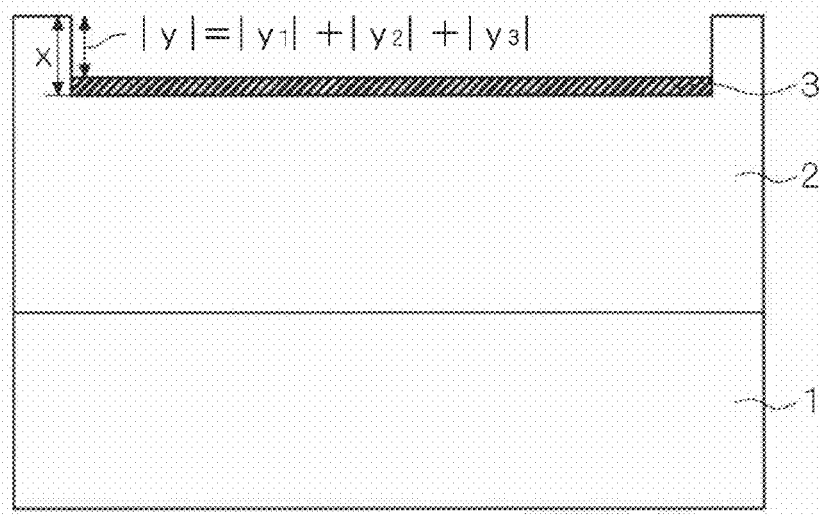

Next, a silicon carbide epitaxial regrowth layer 5 having a film thickness of 0.05 μm to 2.0 μm is layered on the upper surfaces of these layers 2 and 3 by thermal CVD (Chemical Vapor Deposition) at a temperature of 1500° C. to 1600° C. and an atmospheric pressure of 250 mbar, with the carrier gas species of $H_2$ and the product gas species consisting of $SiH_4$ and $C_3H_8$ (see FIG. 16). Since the crystal of the p++ region 3 is significantly degraded by the ion implantation process, high-temperature hydrogen etching with the carrier gas species of $H_2$ strongly acts during the growth in the thermal CVD and the rate of growth on the p++ region 3 thereby becomes lower than that on the unimplanted region. Therefore, as shown in FIG. 16, the silicon carbide epitaxial regrowth layer 5 on the p++ region 3 becomes thinner than the silicon carbide epitaxial regrowth layer 5 on the unimplanted region. After that, the silicon carbide epitaxial regrowth layer 5 is removed by RIE (Reactive Ion Etching), to form such a step having a depth of ($|y|=|y_1|+|y_2|+|y_3|$) as shown in FIG. 17.

Figure 18:
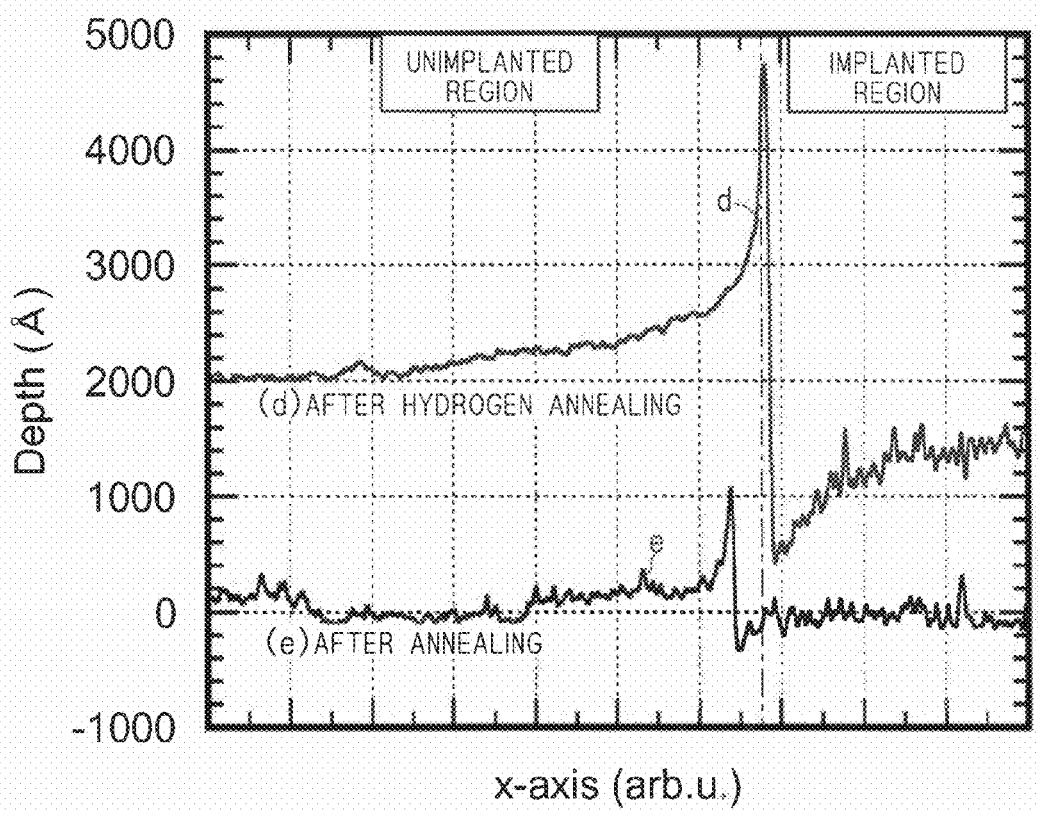
FIG. 18 is a graph showing a step profile (implantation temperature: room temperature or 115° C.) between implanted and unimplanted regions after high-temperature hydrogen annealing in the silicon carbide semiconductor device in accordance with the first preferred embodiment.
Figure 19:
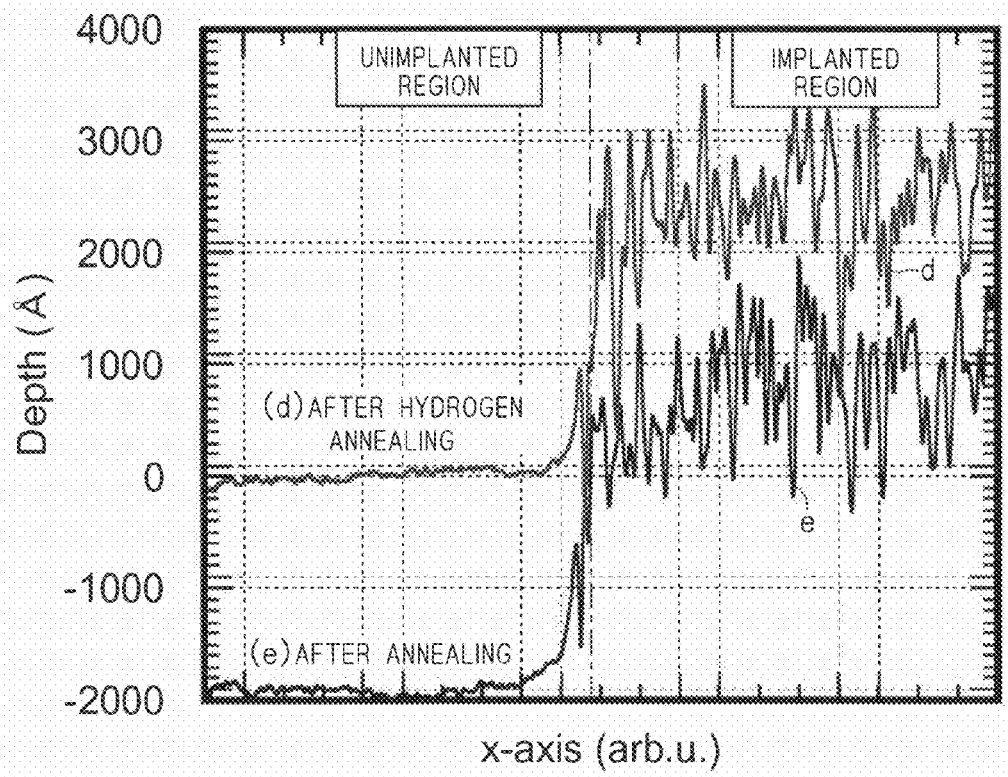
FIG. 19 is a graph showing a step profile (implantation temperature: 150° C.) between implanted and unimplanted regions after high-temperature hydrogen annealing in the silicon carbide semiconductor device in accordance with the first preferred embodiment.
Figure 20:
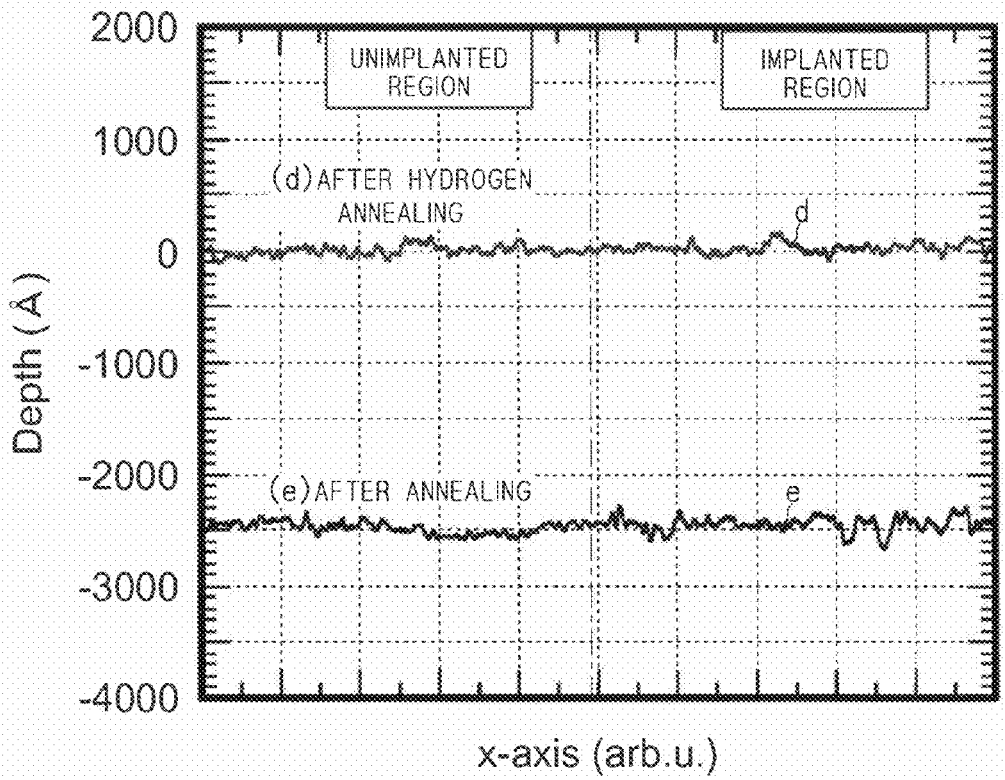
FIG. 20 is a graph showing a step profile (implantation temperature: 175° C. to 500° C.) between implanted and unimplanted regions after high-temperature hydrogen annealing in the silicon carbide semiconductor device in accordance with the first preferred embodiment.

Herein, step profiles between the implanted and unimplanted regions after the high-temperature hydrogen annealing in the step prior to addition of the product gas species consisting of $SiH_4$ and $C_3H_8$ to the carrier gas species of $H_2$ during the thermal CVD process are shown in FIG. 18 (the case at the implantation temperature of room temperature or 115° C.), FIG. 19 (the case at the implantation temperature of 150° C.) and FIG. 20 (the case at the implantation temperature of 175° C. to 500° C.). Herein, the high-temperature hydrogen anneal temperature is set at about 1500° C. In the step profiles after the high-temperature hydrogen annealing, it can be seen that the p++ region 3 in the sample subjected to the ion implantation at the implantation temperature of room temperature or 115° C. is etched markedly more deeper than the unimplanted region while there is no such difference between the regions in the samples subjected to the ion implantation at the implantation temperature of 150° C. to 500° C. These measurement results suggest that the process of forming the p++ region 3 by the ion implantation at the implantation temperature not higher than 115° C. can not be applied to the manufacture of devices requiring the high-temperature hydrogen process such as the silicon carbide epitaxial regrowth.

Figure 21:
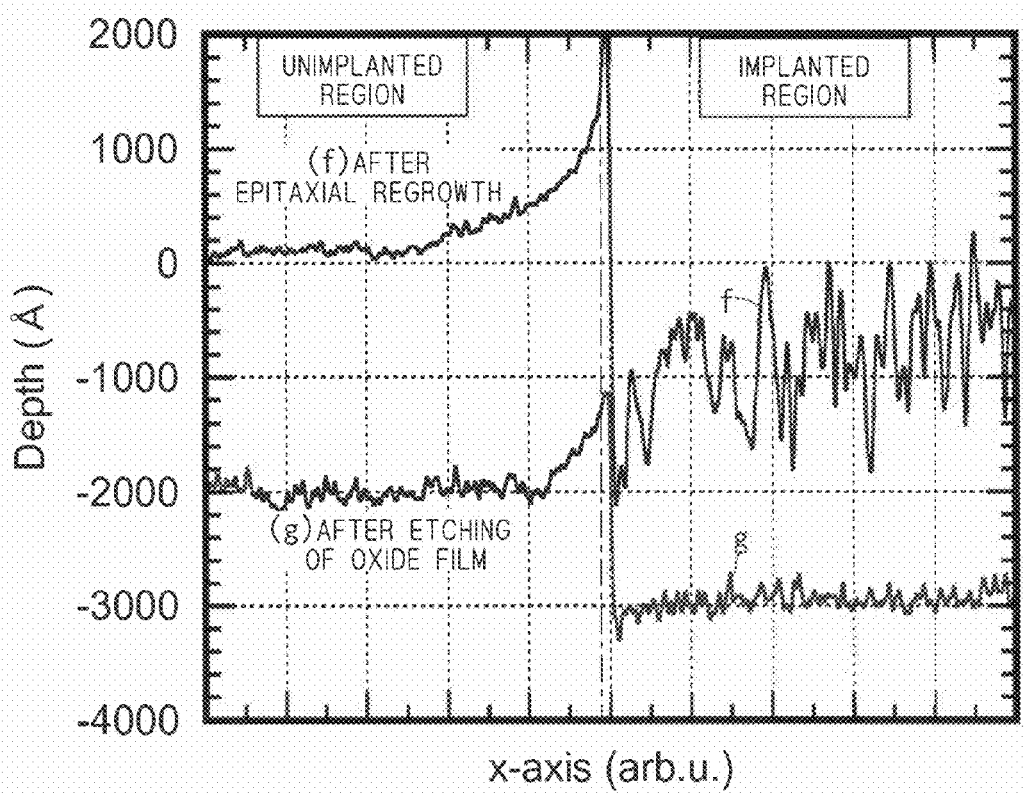
FIG. 21 is a graph showing a step profile (implantation temperature: room temperature or 115° C.) between implanted and unimplanted regions after silicon carbide epitaxial regrowth in the silicon carbide semiconductor device in accordance with the first preferred embodiment.
Figure 22:
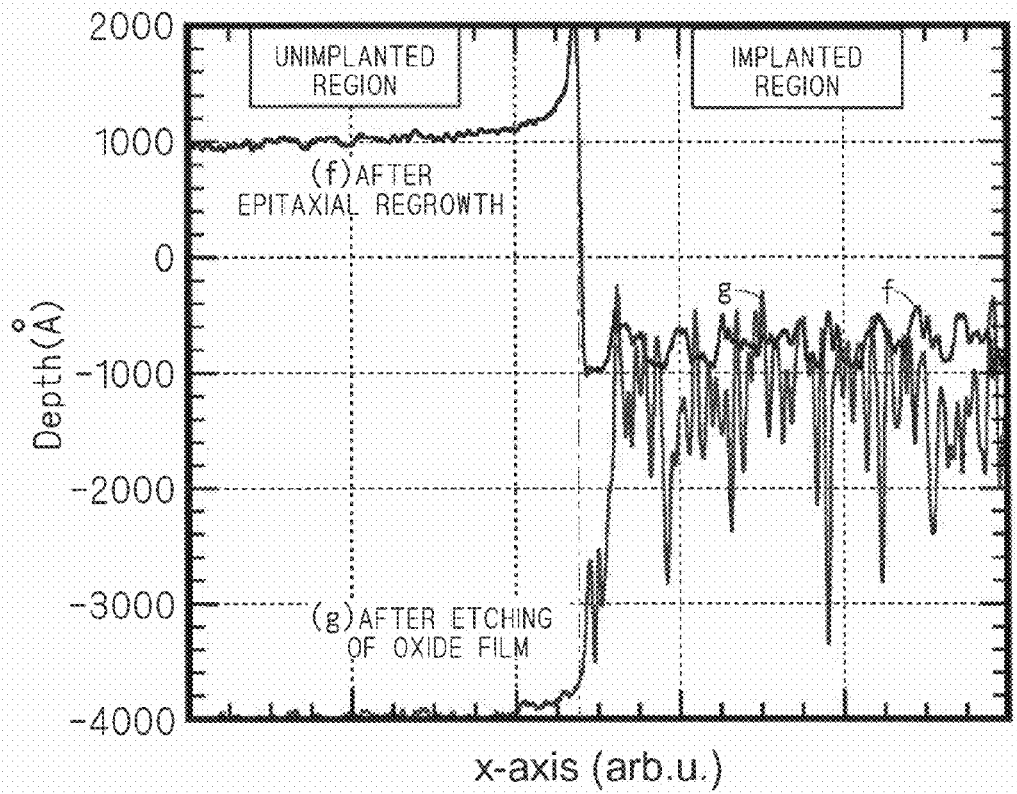
FIG. 22 is a graph showing a step profile (implantation temperature: 150° C.) between implanted and unimplanted regions after silicon carbide epitaxial regrowth in the silicon carbide semiconductor device in accordance with the first preferred embodiment.
Figure 23:
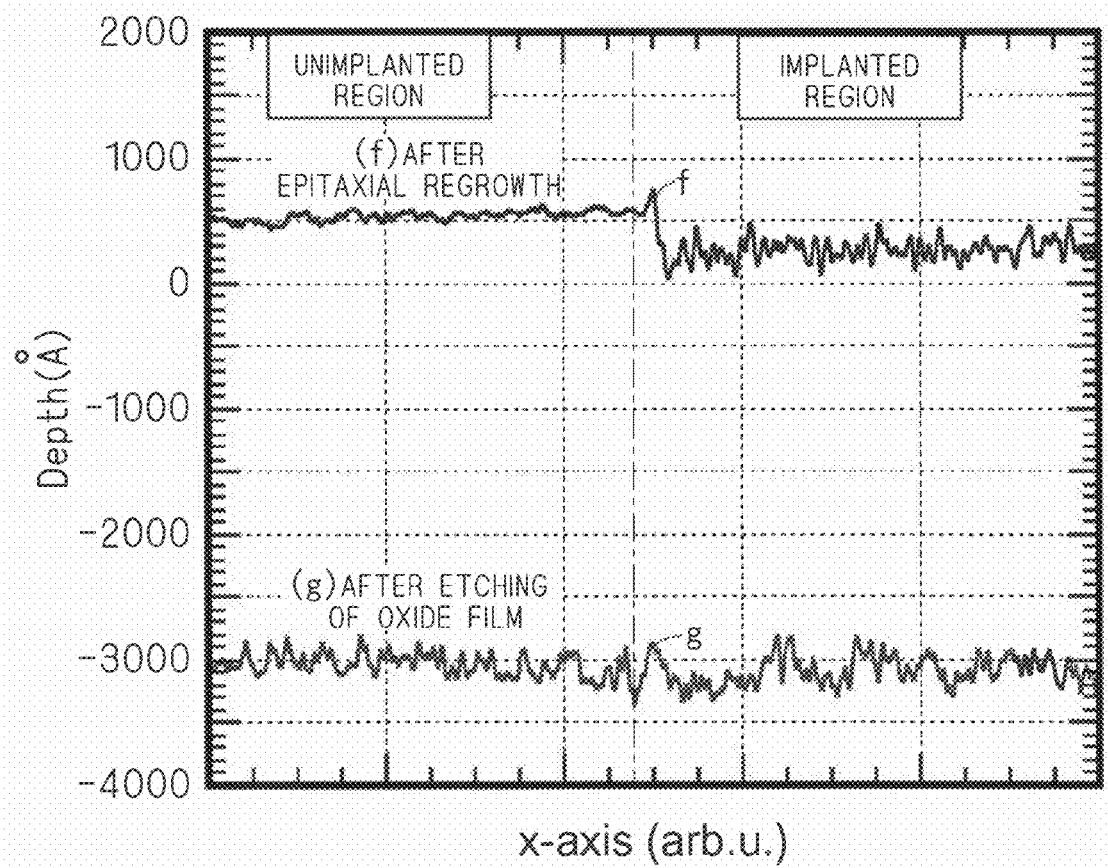
FIG. 23 is a graph showing a step profile (implantation temperature: 175° C. to 500° C.) between implanted and unimplanted regions after silicon carbide epitaxial regrowth in the silicon carbide semiconductor device in accordance with the first preferred embodiment.
Figure 24:
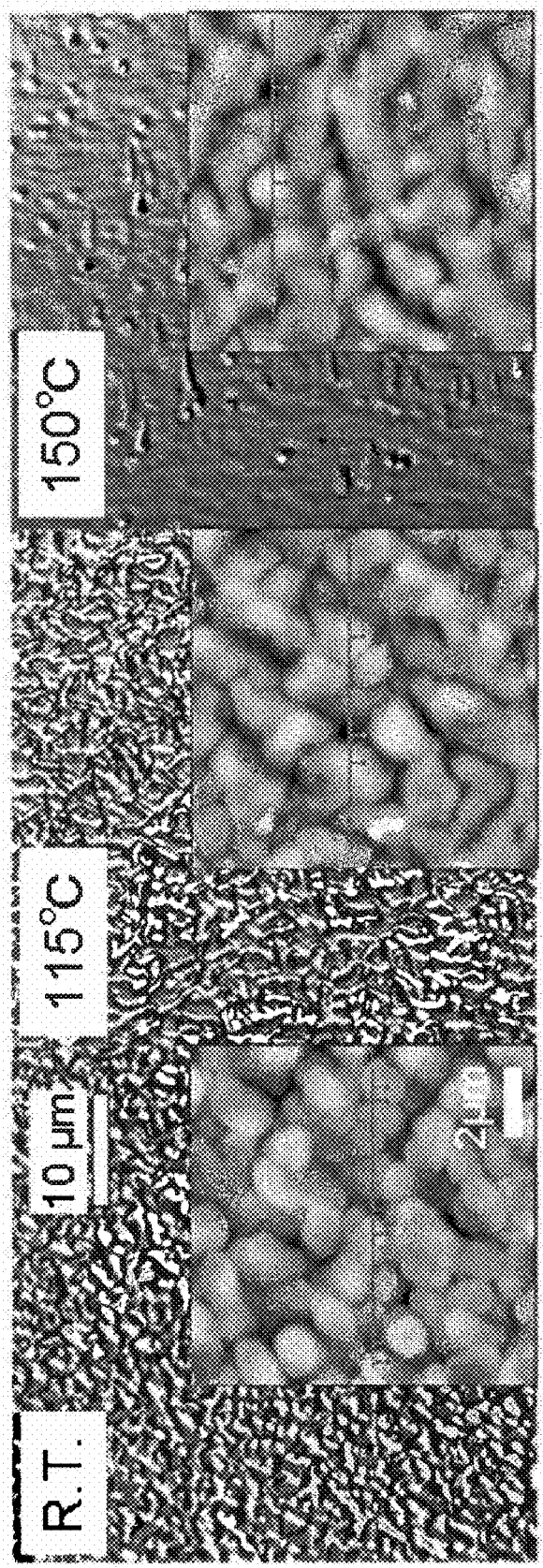
FIGS. 24 to 26 are views each showing a surface morphology of the p++ region after silicon carbide epitaxial regrowth in the silicon carbide semiconductor device in accordance with the first preferred embodiment.
Figure 25:
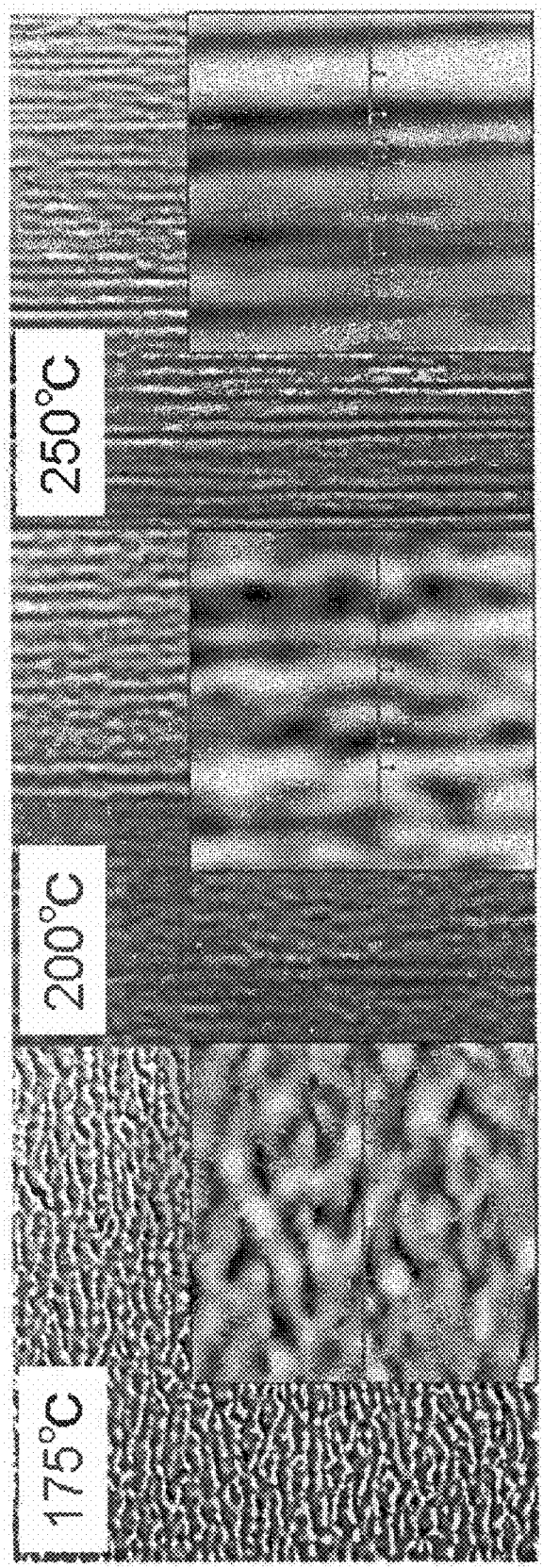
Figure 26:
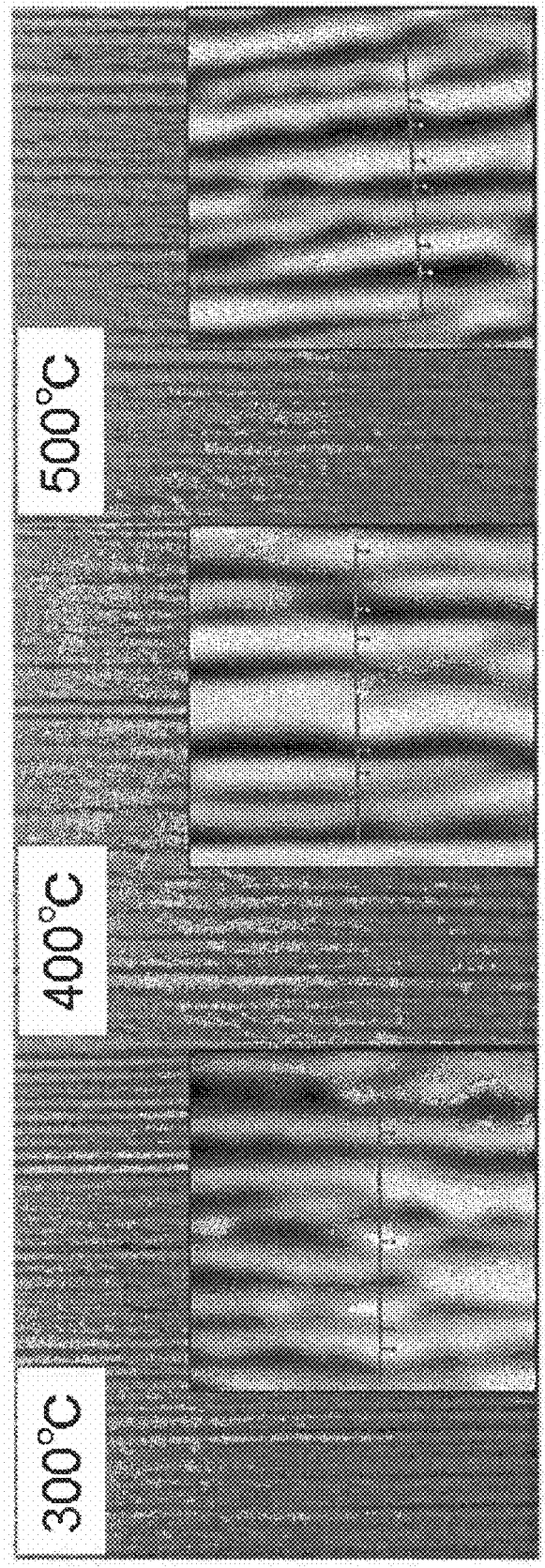

Further, step profiles between the implanted and unimplanted regions after the formation of the silicon carbide epitaxial regrowth layer, together with the step profiles between the implanted and unimplanted regions after the etching of the oxide film, are shown in FIG. 21 (the case at the implantation temperature of room temperature or 115° C.), FIG. 22 (the case at the implantation temperature of 150° C.) and FIG. 23 (the case at the implantation temperature of 175° C. to 500° C.), and the surface morphologies (images of the optical microscope and the AFM) on the p++ region 3 are shown in FIGS. 24 to 26. Herein, the film thickness of the silicon carbide epitaxial regrowth layer 5 is about 0.45 µm. It can be seen from FIG. 21 that the rms of the p++ region 3 in the sample subjected to the ion implantation at the implantation temperature of room temperature or 115° C. increases to about 100 nm by the formation of the silicon carbide epitaxial regrowth layer 5 and the step between these regions partially becomes larger. It can be thought that this is caused by a failure of such etching or step-flow growth in the high-temperature hydrogen as shown in FIG. 18. In contrast to this, the rms of the p++ region 3 in the sample subjected to the ion implantation at the implantation temperature of 150° C. decreases to about 100 nm, and as to the height relation between these regions, the p++ region 3 becomes lower than the unimplanted region by 150 nm. This suggests that the p++ region 3 is hardly etched by the high-temperature hydrogen annealing and the step-flow growth onto the p++ region 3 thereby hardly proceeds. On the other hand, the step between these regions in the sample subjected to the ion implantation at the implantation temperature in the range from 175° C. to 500° C. is about 20 nm in any implantation temperature and there is almost no difference in rate of silicon carbide epitaxial regrowth between on the p++ region 3 and on the unimplanted region. Herein, in order to appropriately form the p++ region 3, the relation of $|x|>(|y_1|+|y_2|+|y_3|)$ should be satisfied. The measurement results of FIGS. 21 to 23 suggest that it is essential to perform the ion implantation at the implantation temperature not lower than 175° C. in the process of forming the p++ region 3 in the manufacture of devices requiring the formation of the silicon carbide epitaxial regrowth layer 5 after the formation of the p++ region 3.

The Second Preferred Embodiment

Discussion will be made on the electrical characteristics and the p base ohmic contact resistivity of a p++ region for silicon carbide p-type base ohmic contact manufactured by a method of manufacturing a silicon carbide semiconductor device in accordance with the second preferred embodiment.

Figure 27:
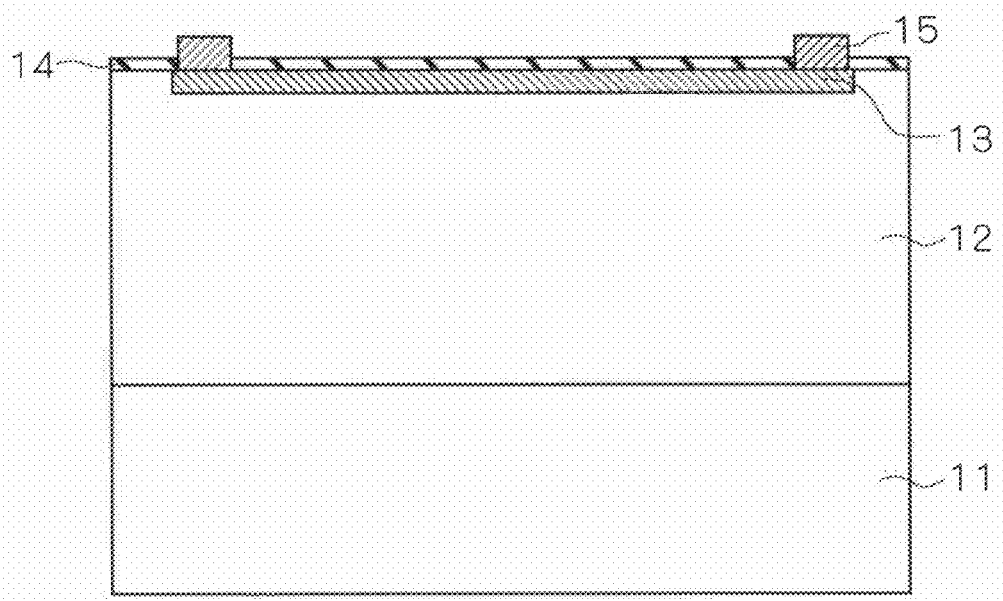
FIG. 27 is a longitudinal section showing a structure of a silicon carbide semiconductor device used to evaluate the hole carrier density and the Hall mobility of a p++ region for silicon carbide p-type base ohmic contact by Hall measurement, which is manufactured by a method of manufacturing a silicon carbide semiconductor device in accordance with a second preferred embodiment.

FIG. 27 is a longitudinal section showing a structure of a semiconductor device used to evaluate the hole carrier density and the Hall mobility of the p++ region for silicon carbide p-type base ohmic contact by Hall measurement. In FIG. 27, on a silicon carbide substrate 11, a silicon carbide epitaxial layer 12 is formed by growth and from an upper surface of the silicon carbide epitaxial layer 12 toward the inside of the layer 12, a p++ region 13 is formed. An ohmic electrode 15 is formed on an upper surface of the p++ region 13. Further, on the upper surfaces of the p++ region 13 and the silicon carbide epitaxial layer 12 except a contact region with the ohmic electrode 15, a thermal oxide film 14 is formed.

On the other hand, FIG. 37 is a longitudinal section showing a structure of a semiconductor device used to evaluate the resistivity of a silicon carbide p-type base ohmic contact by the TLM (Transfer Length Method) measurement. In FIG. 37, on a silicon carbide substrate 21, a silicon carbide epitaxial layer 22 is formed by growth and from an upper surface of the silicon carbide epitaxial layer 22 toward the inside of the layer 22, a p++ region 23 is formed. A plurality of ohmic electrodes 25 are formed on an upper surface of the p++ region 23. Further, on the upper surfaces of the p++ region 23 and the silicon carbide epitaxial layer 22 except contact regions with the ohmic electrode 25, a thermal oxide film 24 is formed.

Next, the method of manufacturing a semiconductor device for Hall measurement in accordance with the second preferred embodiment will be discussed with reference to FIGS. 28 to 33.

Figure 28:
Figure 29:

First, the silicon carbide epitaxial layer 12 having a film thickness not less than 0.3 µm is layered on an upper surface of the silicon carbide substrate 11 having an off angle by thermal CVD (Chemical Vapor Deposition) at a temperature of 1500° C. to 1600° C. and an atmospheric pressure of 250 mbar, with the carrier gas species of $H_2$ and the product gas species consisting of $SiH_4$ and $C_3H_8$ (see FIG. 28).

Figure 30:
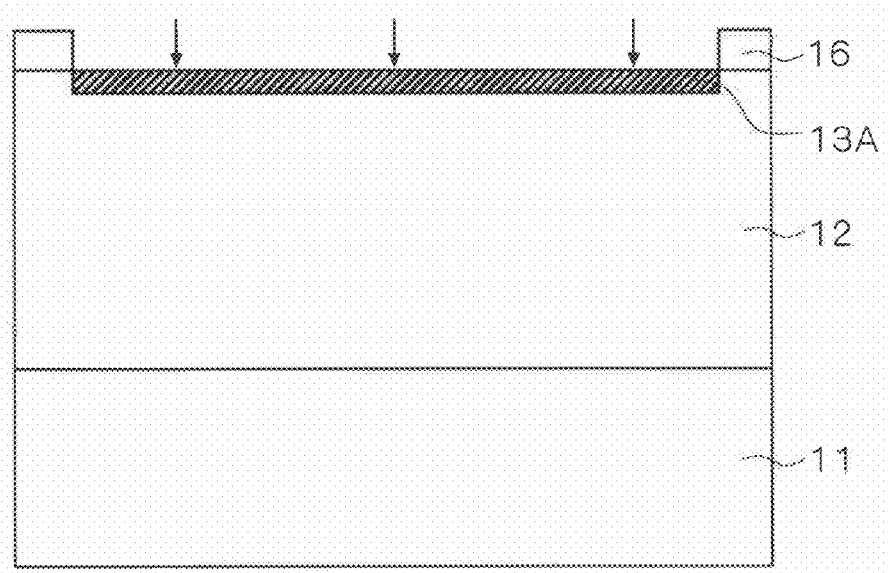
Figure 31:

Next, a selective ion implantation mask 16 is formed on the upper surface of the silicon carbide epitaxial layer 12 (see FIG. 29) and then any one type of ions among Al ions, B ions and Ga ions having a concentration of about $2e20$ $cm^{-3}$ are implanted by using the selective ion implantation mask 16 into the silicon carbide epitaxial layer 12, to form a p++ region 13A (see FIG. 30). This ion implantation is performed while the silicon carbide member (11+12) is kept at implantation temperatures in a range from the room temperature to 500° C. After that, the selective ion implantation mask 16 is removed and the activation annealing process is performed on the p++ region 13A at a temperature in a range from 1400° C. to 2000° C., to form the p++ region 13 (see FIG. 31).

Figure 32:
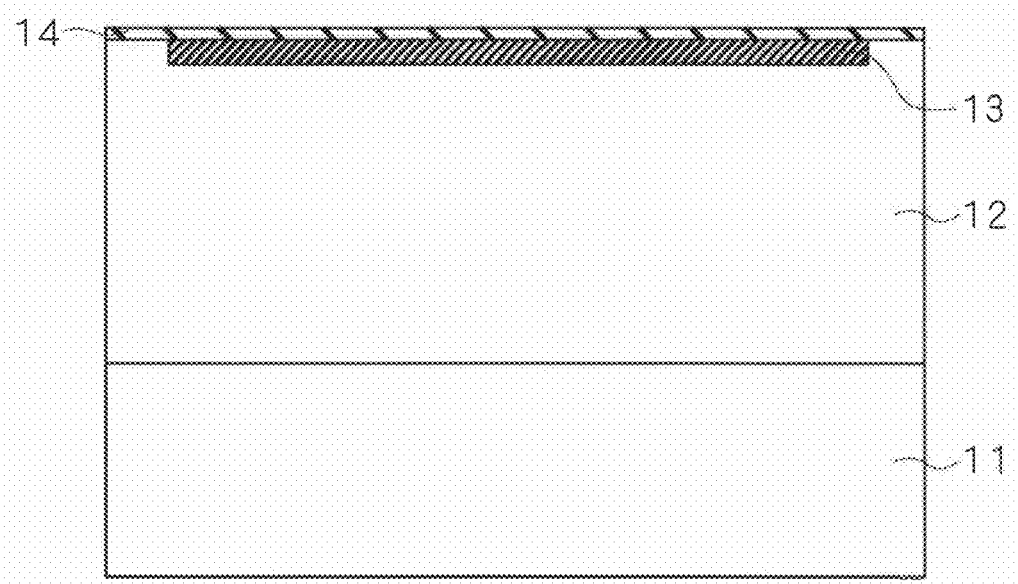
Figure 39:
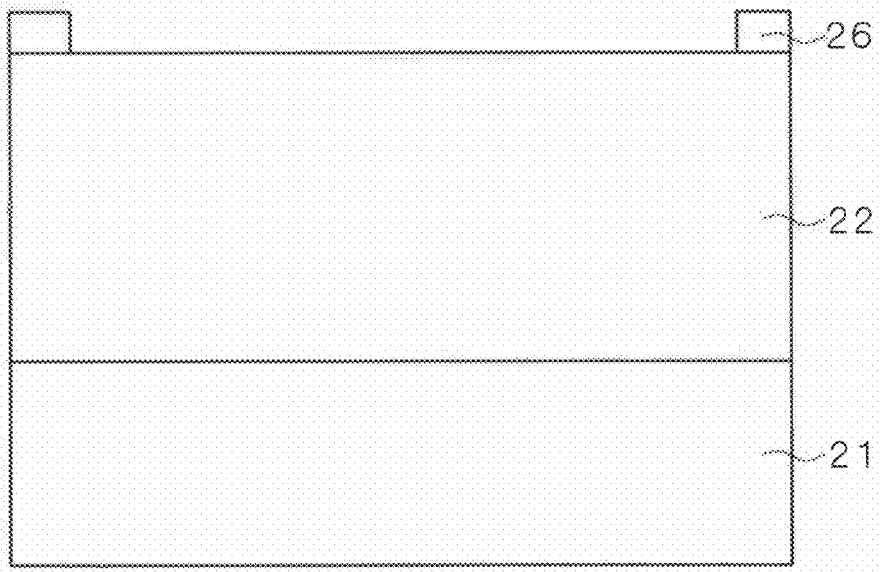

Next, the thermal oxide film 14 is entirely formed on an exposed surface of the silicon carbide epitaxial layer 12 by thermal oxidation (see FIG. 32).

Next, after removing only a region of the thermal oxide film 14 where the ohmic electrode 15 is to be formed, Ni is layered on the film-removed region and the Ni ohmic electrode 15 is formed on a surface of an end portion of the p++ region 13 (see FIG. 33). As the material of the ohmic electrode 15, instead of Ni, Ti, Al, Mo, Cr, Pt, W, Si or TiC may be used or an alloy of these metals may be used.

Next, in order to alloy the Ni ohmic electrode 15 with the silicon carbide in contact with this ohmic electrode 15, a heat treatment is performed on the silicon carbide member (11+12) at a temperature of 950° C. to 1000° C. and the rate of temperature rise of 10° C./sec to 25° C./sec for 20 to 60 seconds. This completes the silicon carbide semiconductor device shown in FIG. 27.

FIG. 34 shows the implantation temperature dependence of the hole carrier density (plot: ○ blank circle) and the Hall mobility (plot: ▲ solid triangle) in the p++ region 13, which is obtained by the Hall measurement. The exemplary measurement of FIG. 34, however, shows only data in a case where the activation anneal temperature for the p++ region 13A is 1700° C. and the implantation temperature is 175° C. or higher in consideration of the evaluation result discussed in the first preferred embodiment. It can be seen from FIG. 34 that the hole carrier density shows almost no dependence on the implantation temperature at the implantation temperature in a range from 250° C. to 500° C. while the hole carrier density sharply increases at the implantation temperature in a range not higher than 250° C. and not lower than 175° C. Further, in response to the increase of the hole carrier density, the Hall mobility sharply decreases. This phenomenon shows that crystal defects having an acceptor-type energy level are distributed higher densely in the ion-implanted p++ region 13 at the holding temperature of the silicon carbide member (11+12) in the range not higher than 250° C. and not lower than 175° C. during the implantation.

FIG. 35 shows the activation anneal temperature dependence and the implantation temperature dependence of the hole carrier density in the p++ region 13, which is obtained by the Hall measurement, and FIG. 36 shows the activation anneal temperature dependence and the implantation temperature dependence of the Hall mobility in the p++ region 13, which is obtained by the Hall measurement. Further, though the present applicant inventors also perform the same measurements on the cases at the implantation temperatures of 400° C. and 500° C., since the measurement results are almost the same as the case at the implantation temperature of 300° C., the measurement data in the cases at the implantation temperatures of 400° C. and 500° C. are not shown in FIG. 35 or 36. It can be seen from FIGS. 35 and 36 that in both the cases where the holding temperatures (implantation temperatures) of the silicon carbide member (11+12) are 250° C. and 300° C. during the implantation, in the samples implanted with Al ions, the hole carrier density increases and the Hall mobility conversely decreases as the activation anneal temperature becomes higher. This phenomenon shows that the implanted Al ions are arranged in a silicon carbide lattice site and electrically activated, to thereby increase the hole carrier density, and the ionized impurity scattering factor density increases, to thereby decrease the Hall mobility. On the other hand, in both the cases where the implantation temperatures are 175° C. and 200° C., in the samples implanted with Al ions, the hole carrier density increases as the activation anneal temperature becomes higher but the Hall mobility takes low value of about 3 $cm^2/Vs$ regardless of the activation anneal temperature. This phenomenon suggests that the Hall mobility strongly depends on a scattering mechanism other than the ionized impurity scattering which is increased by activation of the implanted Al ions. In any activation anneal temperature, the hole carrier densities of the samples implanted with Al ions at the implantation temperatures of 175° C. and 200° C. are higher than those of the implanted samples at the implantation temperatures of 250° C. and 300° C. and especially, the ratio becomes significantly larger as the activation anneal temperature is lower. From these results, it can be seen that as the origin of the measured hole carriers, there are an Al acceptor which increases as the activation anneal temperature becomes higher and an acceptor-type crystal defect which increase as the temperature for implantation of Al ions becomes lower.

Next, the method of manufacturing a semiconductor device for TLM measurement in accordance with the second preferred embodiment will be discussed with reference to FIGS. 38 to 43.

First, the silicon carbide epitaxial layer 22 having a film thickness not less than 0.3 μm is layered on an upper surface of the silicon carbide substrate 21 by thermal CVD (Chemical Vapor Deposition) at a temperature of 1500° C. to 1600° C. and an atmospheric pressure of 250 mbar, with the carrier gas species of $H_2$ and the product gas species consisting of $SiH_4$ and $C_3H_8$ (see FIG. 38).

Figure 40:
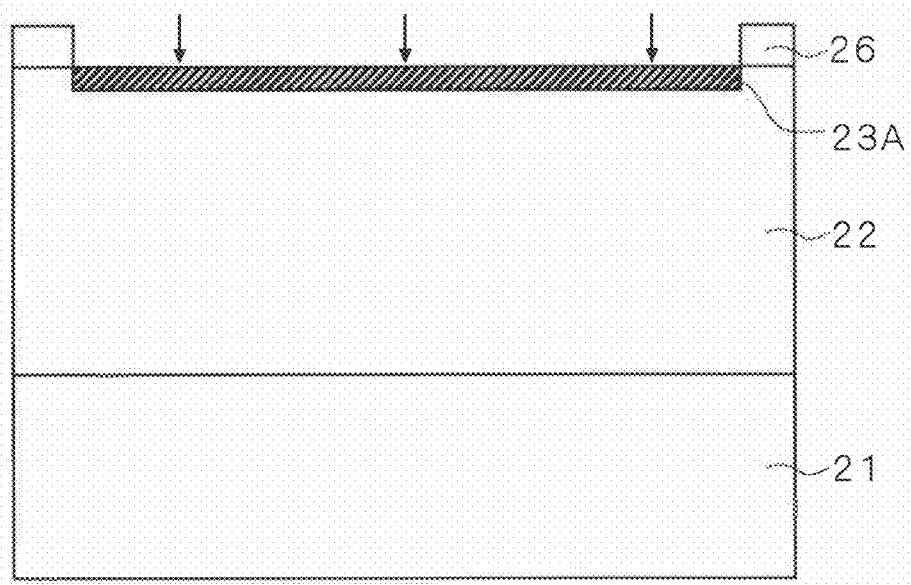
Figure 41:
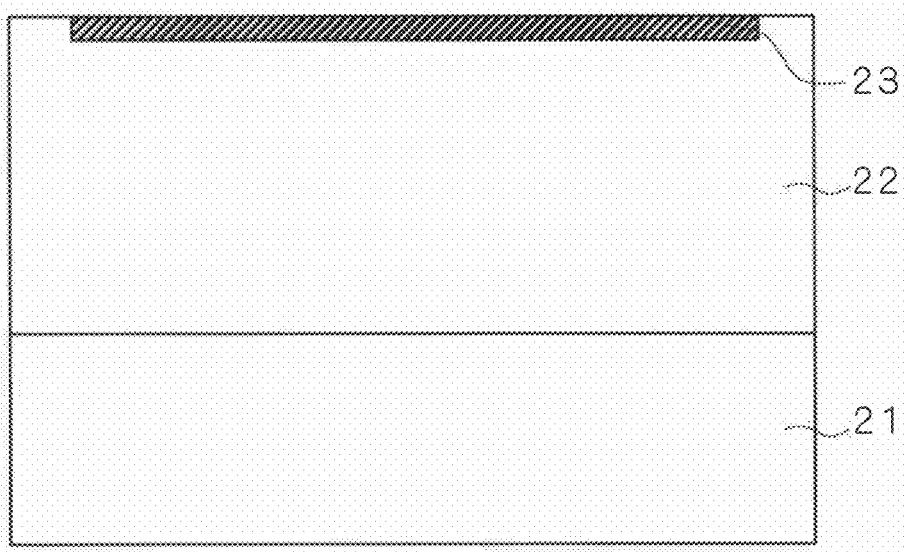

Next, a selective ion implantation mask 26 is formed on the upper surface of the silicon carbide epitaxial layer 22 (see FIG. 39) and then any one type of ions among Al ions, B ions and Ga ions having a concentration of about 2e20 $cm^{-3}$ are implanted into the silicon carbide epitaxial layer 22, to form a p++ region 23A before the activation annealing (see FIG. 40). This ion implantation is performed while the silicon carbide member (21+22) is kept at temperatures in a range from the room temperature to 500° C. After that, the selective ion implantation mask 26 is removed and then the activation annealing process is performed at a temperature in a range from 1400° C. to 2000° C., to form the p++ region 23 (see FIG. 41).

Figure 42:
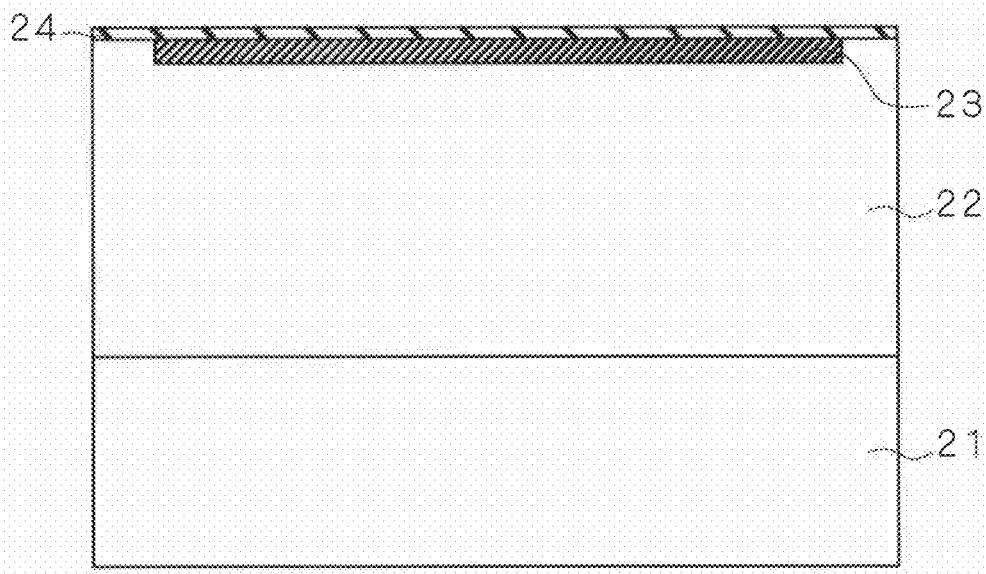

Next, the thermal oxide film 24 is entirely formed on an exposed surface of the silicon carbide epitaxial layer 22 by thermal oxidation (see FIG. 42).

Figure 43:
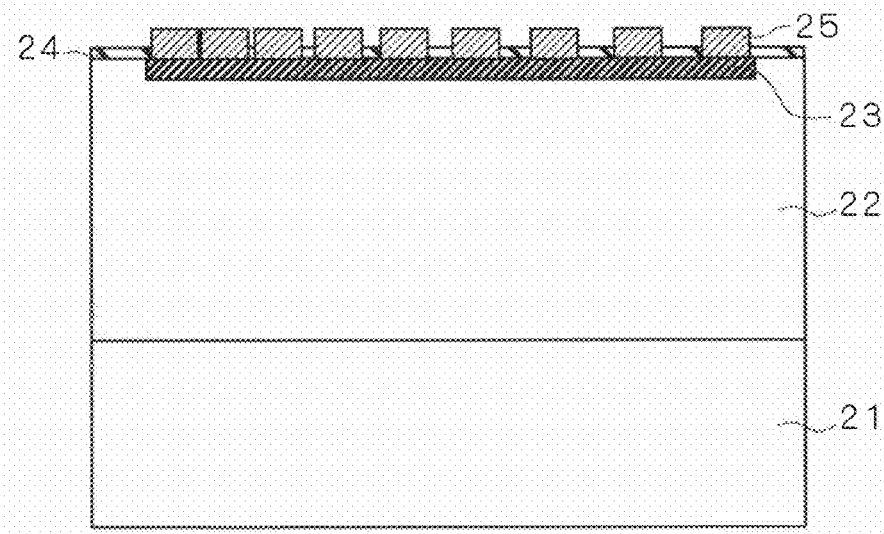

Next, after removing only regions of the thermal oxide film 24 where the ohmic electrodes 25 are to be formed, the ohmic electrodes 25 are formed on the film-removed regions (see FIG. 43). This completes the semiconductor device for the TLM measurement shown in FIG. 37.

Figure 44:
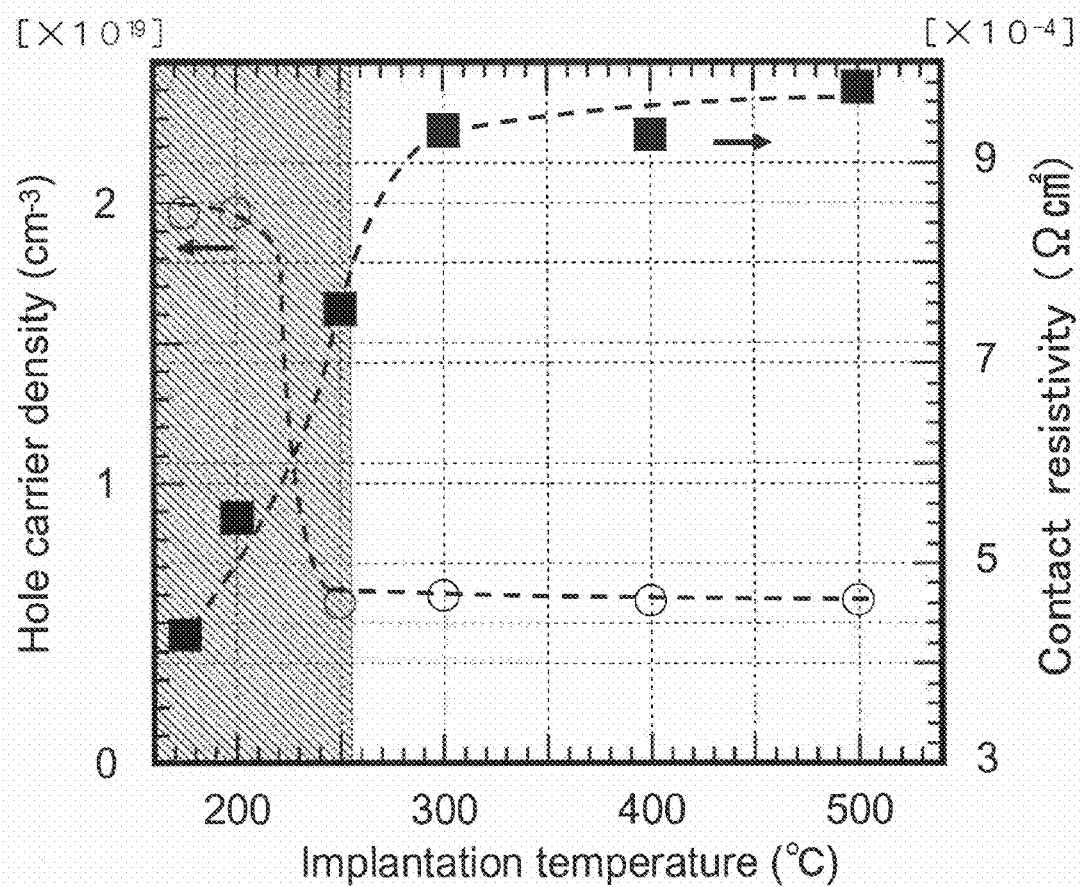
FIG. 44 is a graph showing the implantation temperature dependence of the resistivity (plot: ■ solid square) of the p-type base ohmic contact manufactured by the method of manufacturing a silicon carbide semiconductor device in accordance with the second preferred embodiment.

FIG. 44 shows the implantation temperature dependence of the resistivity of the p-type base ohmic contact (plot: ■ solid square), together with the implantation temperature dependence of the Hall mobility, which is obtained by the TLM measurement. Also in FIG. 44, the lower limit value of the ion implantation temperature is 175° C. in consideration of the evaluation result discussed in the first preferred embodiment. As clearly can be seen from FIG. 44, at the temperature in the range not higher than 250° C. and not lower than 175° C., the hole carrier density increases and the contact resistivity decreases as the implantation temperature becomes lower. Further, the contact resistivity decreases as the implantation temperature becomes lower in the range not higher than 300° C. and not lower than 175° C. It is known that ohmic contact resistivity between semiconductor and metal depends on the defect density of the interface or the doping concentration of the semiconductor, and as a cause of the implantation temperature dependence of the contact resistivity which is obtained in this measurement, any of the above well-known causes is possible.

Figure 45:
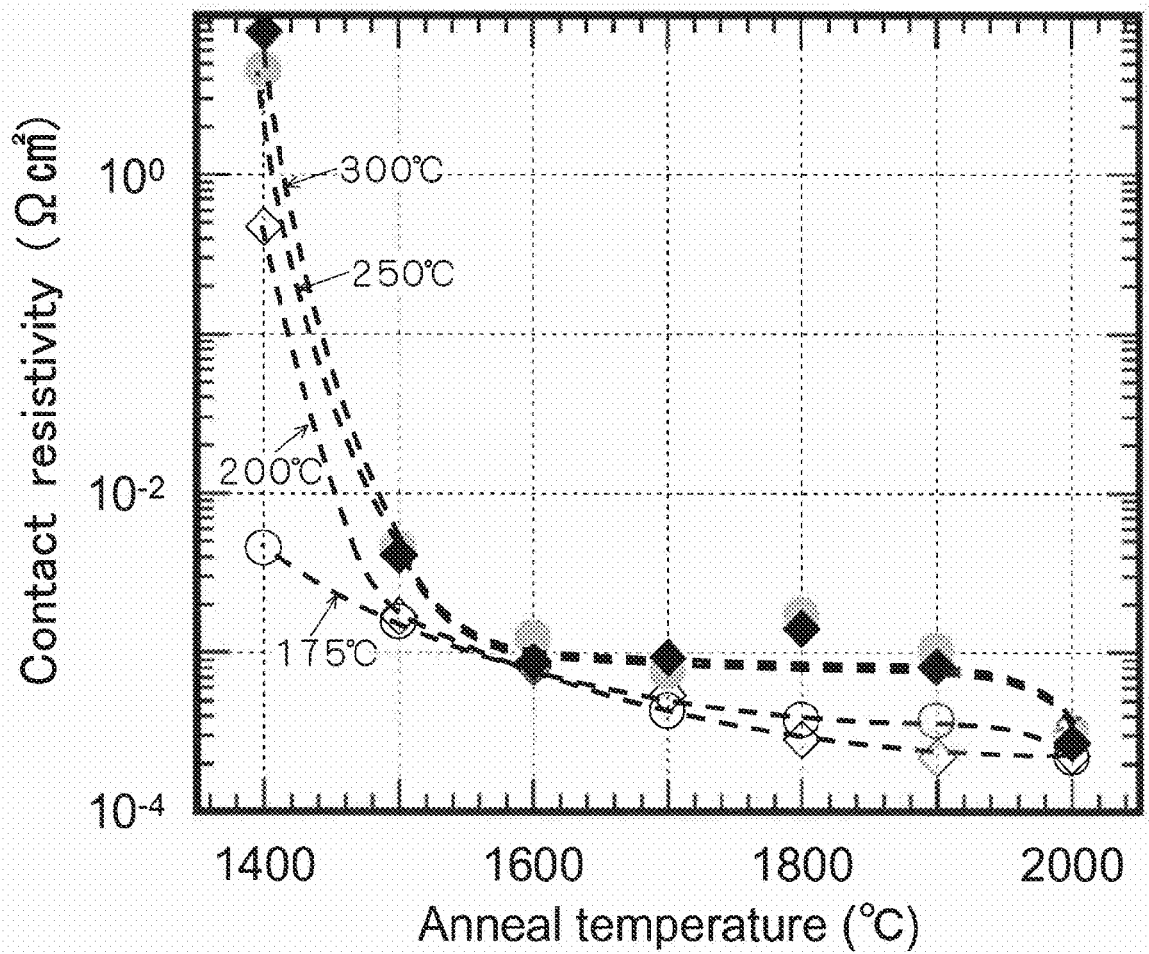
FIG. 45 is a graph showing the activation anneal temperature dependence and the implantation temperature dependence of the resistivity of the p-type base ohmic contact manufactured by the method of manufacturing a silicon carbide semiconductor device in accordance with the second preferred embodiment.

Next, FIG. 45 shows the anneal temperature dependence of the resistivity of the p-type ohmic contact at various implantation temperatures, which is obtained by the TLM measurement. As can be seen from FIG. 45, in the samples at the implantation temperatures, the resistivity of the p-type ohmic contact generally decreases as the activation anneal temperature becomes higher. As one of the causes of this phenomenon, an increase of the activated Al acceptor density is possible. Further, it can be seen from FIG. 45 that the contact resistivity depends on the Al implantation temperature more strongly as the activation anneal temperature becomes lower, and there is a possibility that this phenomenon should be largely affected by the density of acceptor-type crystal defects or interface defects which are induced by the ion implantation. At the implantation temperature in the range from 175° C. to 200° C., it is possible to suppress the ohmic contact resistivity to about 1e-3 $\Omega cm^2$ or lower regardless of the implantation temperature condition by setting the activation anneal temperature in a range from 1600° C. to 2000° C.

In the silicon carbide p-type base ohmic contact manufactured in accordance with the above-discussed second preferred embodiment, if the holding temperature (implantation temperature) of silicon carbide during the ion implantation is set in the range not lower than 175° C. and not higher than 300° C., more preferably in the range not lower than 175° C. and not higher than 200° C., the ohmic contact resistivity becomes lower than that in the case where the ion implantation is performed at the implantation temperature over 300° C. Moreover, under the conditions shown in the second preferred embodiment, like in the first preferred embodiment, there occurs no process failure which would occur when the ion implantation is performed at the room temperature.

The Third Preferred Embodiment

The third preferred embodiment relates to a method of manufacturing a silicon carbide semiconductor device, on which the above-discussed evaluation results which are clearly shown in the first and second preferred embodiments are reflected.

Figure 46:
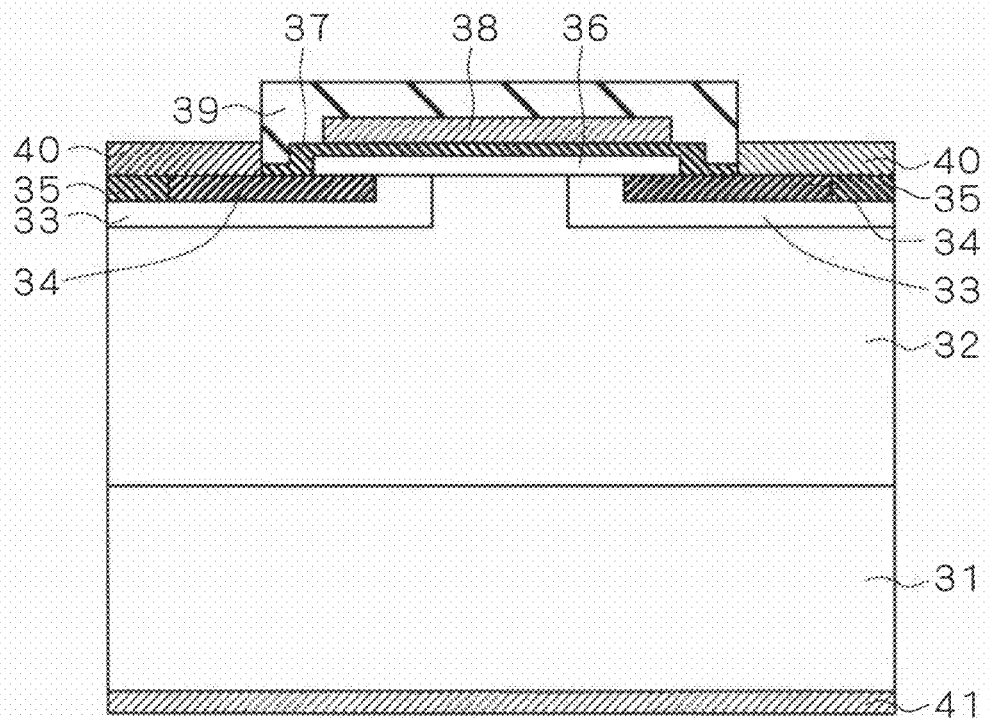
FIG. 46 is a longitudinal section showing a structure of a silicon carbide MOSFET manufactured by a method of manufacturing a silicon carbide semiconductor device in accordance with a third preferred embodiment.

FIG. 46 is a longitudinal section showing a structure of a silicon carbide epitaxial channel MOSFET, and reference numerals represent the following constituent elements. Specifically, reference numeral 31 represents a silicon carbide substrate, reference numeral 32 represents a silicon carbide epitaxial layer (which corresponds to a silicon carbide layer), reference numeral 33 represents a p base region, reference numeral 34 represents an n source region, reference numeral 35 represents a p++ region for p-type base contact, reference numeral 36 represents a silicon carbide epitaxial regrowth layer for channel, reference numeral 37 represents a gate insulating film formed of e.g., a gate oxide film, reference numeral 38 represents a gate electrode, reference numeral 39 represents an interlayer insulating film, reference numeral 40 represents a source electrode and reference numeral 41 represents a drain electrode.

Next, the method of manufacturing a silicon carbide semiconductor device in accordance with the third preferred embodiment will be discussed with reference to FIGS. 47 to 55.

Figure 47:

First, the silicon carbide epitaxial layer 32 having a film thickness in a range from 1.0 μm to 100 μm is layered on an upper surface of the silicon carbide substrate 31 having an off angle by thermal CVD (Chemical Vapor Deposition) at a temperature of 1500° C. to 1600° C. and an atmospheric pressure of 250 mbar, with the carrier gas species of $H_2$ and the product gas species consisting of $SiH_4$ and $C_3H_8$ (see FIG. 47).

Next, a selective ion implantation mask (not shown) is formed on the upper surface of the silicon carbide epitaxial layer 32 and then any one type of ions among Al ions, B ions and Ga ions having a concentration in a range from 1e17 $cm^{-3}$ to 1e19 $cm^{-3}$ are implanted by using the selective ion implantation mask from the upper surface of the silicon carbide epitaxial layer 32 into the inside of the layer 32 to the depth in a range from 0.5 μm to 3.0 μm, to form a pair of p base regions 33 which are opposed to each other (see FIG. 48). After that, the above selective ion implantation mask is removed and a new selective ion implantation mask (not shown) is formed on the upper surface of the silicon carbide epitaxial layer 32, and then any one type of ions among N ions, As ions and P ions having a concentration in a range from 1e18 $cm^{-3}$ to 1e20 $cm^{-3}$ are implanted by using the new selective ion implantation mask from respective surfaces of the p base regions 33 toward the insides of the regions 33 to the depth in a range from 0.1 μm to 2.0 μm, to form the n source regions 34. After that, the new selective ion implantation mask is removed (see FIG. 48).

Next, a selective ion implantation mask (not shown) is formed on the upper surface of the silicon carbide epitaxial layer 32 and then any one type of ions among Al ions, B ions and Ga ions having a concentration in a range from 1e19 $cm^{-3}$ to 1e21 $cm^{-3}$ are implanted by using the selective ion implantation mask from outside regions in the respective surfaces (main surfaces) of the p base regions 33, which are adjacent to surface end portions of the n source regions 34, toward the insides of the p base regions 33 to the depth in a range from 0.1 μm to 2.0 μm, to form regions which are to become the p++ regions for p-type base contact (which correspond to p-type silicon carbide regions) 35 each having p-type impurity concentration much higher than that of the p base regions 33. This ion implantation step is performed while the silicon carbide member (31+32) is kept at the implantation temperature in the range not lower than 175° C. and not higher than 300° C., more preferably in the range not lower than 175° C. and not higher than 200° C. After the above ion implantation step is finished, the selective ion implantation mask is removed and then the activation annealing process is performed at a temperature in a range from 1400° C. to 2100° C., to thereby complete the p base regions 33, the n source regions 34 and p++ regions for p-type base contact 35 (see FIG. 49). Further, as mentioned on FIG. 45 in the second preferred embodiment, especially in the case where the ohmic contact resistivity is set to a low value of about 1e-3 $\Omega cm^2$ or lower, at the implantation temperature in the range not lower than 175° C. and not higher than 200° C., it is necessary to set the activation anneal temperature in the range from 1600° C. to 2000° C.

Figure 50:
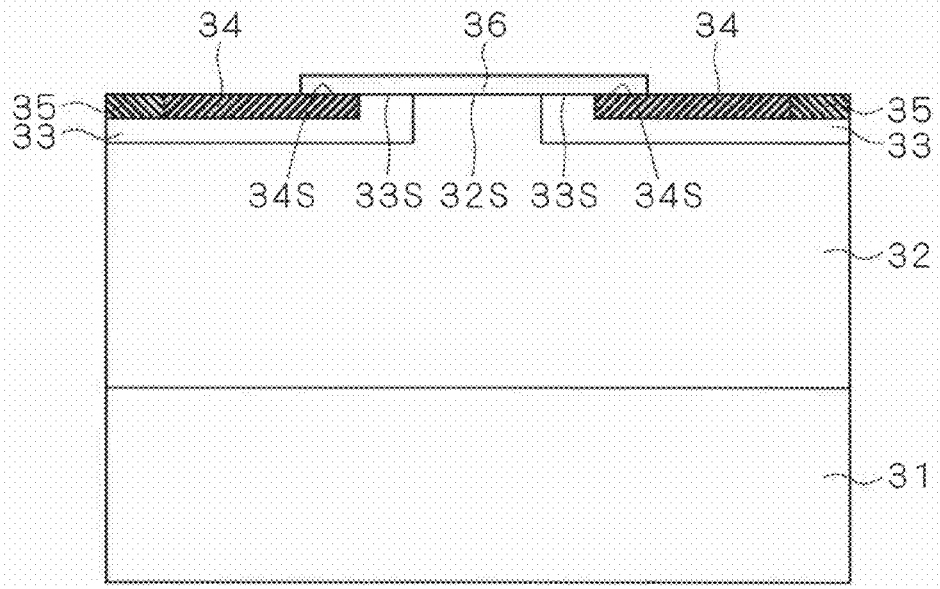

Next, the silicon carbide epitaxial regrowth layer for channel is layered on the silicon carbide epitaxial layer 32 and then the silicon carbide epitaxial regrowth layer for channel 36 is formed by photolithography and RIE (Reactive Ion Etching) so that a main surface 32S of the silicon carbide epitaxial layer 32 which is exposed between the pair of p base regions 33 should be positioned at the center of a lower surface of the layer 36 and respective end portion surfaces 33S of the p base regions 33 and respective end portion surfaces 34S of the n source regions 34 should be positioned at end portions of the lower surface of the layer 36 (see FIG. 50).

Alternatively, without forming the silicon carbide epitaxial regrowth layer for channel 36, the process may go to the next step.

Figure 51:
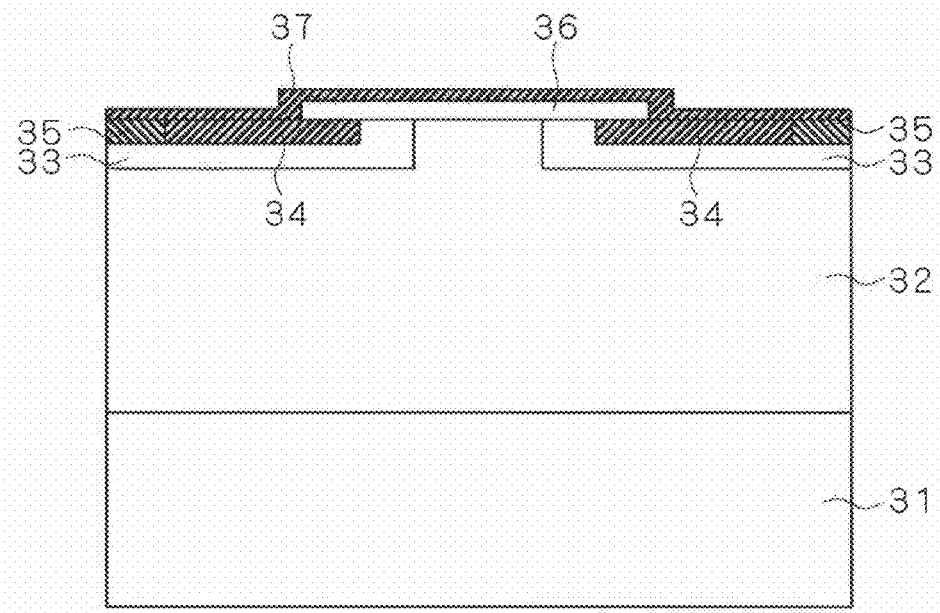

Next, the gate insulating film 37 is formed entirely on the device substrate (see FIG. 51).

Figure 52:
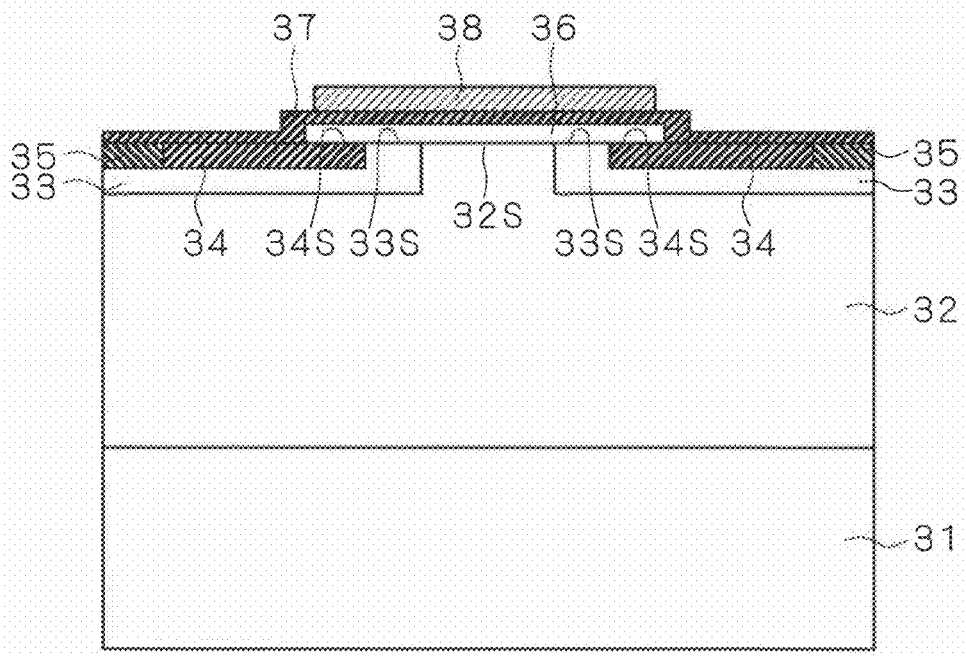

Next, by photolithography and RIE (Reactive Ion Etching), the gate electrode 38 is formed on a surface of the gate insulating film 37 so that the main surface 32S of the silicon carbide epitaxial layer 32 which is exposed between the pair of p base regions 33 should be positioned at the center of the gate electrode 38 and the respective end portion surfaces 33S of the p base regions 33 and the respective end portion surfaces 34S of the n source regions 34 should be positioned immediately below end portions of the gate electrode 38 (see FIG. 52).

Figure 53:
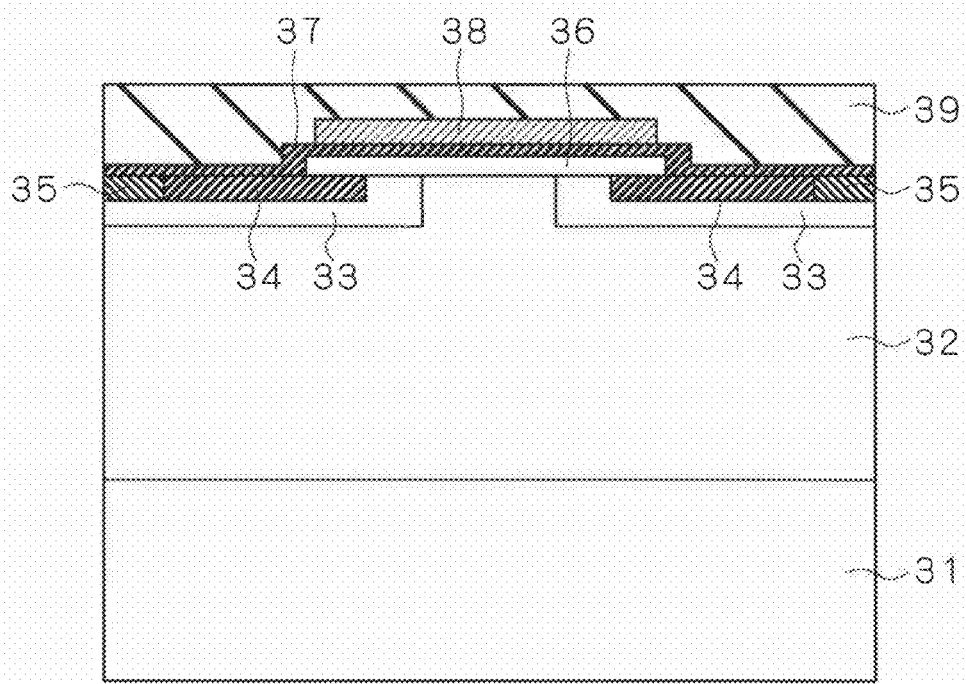

Next, the interlayer insulating film 39 is layered entirely on the device to electrically insulate the source and the gate (see FIG. 53).

Figure 54:
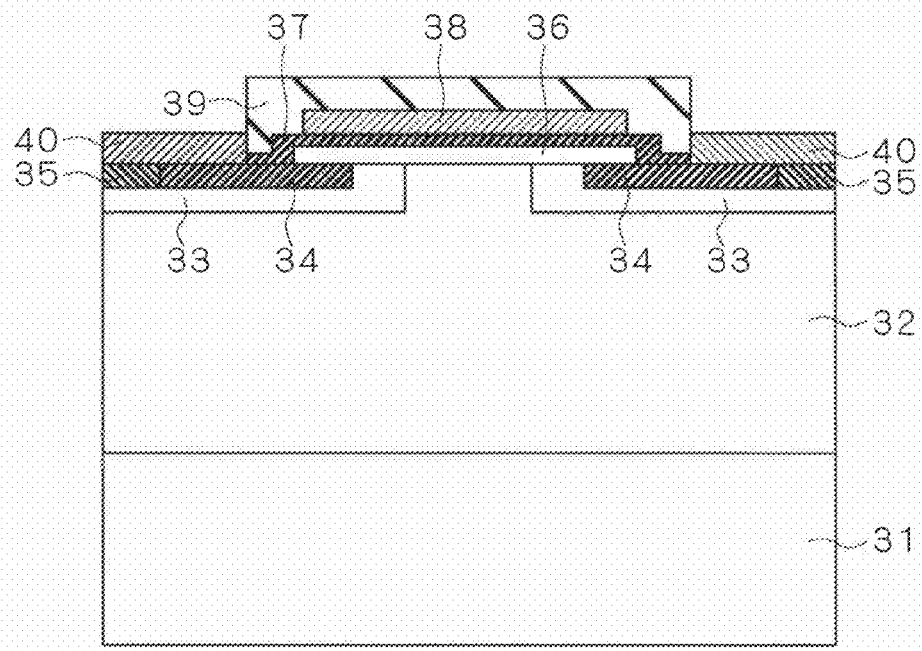
Figure 55:
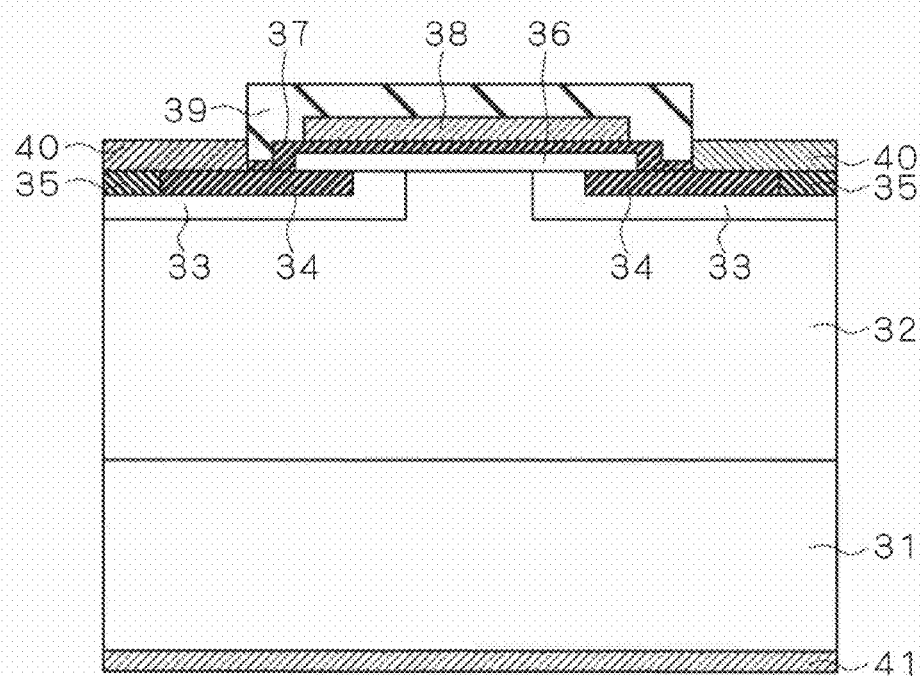

Next, portions of the gate insulating film 37 and the interlayer insulating film 39 on the surfaces of the n source regions 34 and the surfaces of the p++ regions for p-type base contact 35 are removed by photolithography and etching (see FIG. 54). After that, Ni layers are layered on the exposed portions of the surfaces of the n source regions 34 and the surfaces of the p++ regions for p-type base contact 35, to form Ni contact electrodes 40 common to the source and the base (see FIG. 54). As a material for the ormic contact electrode 40, instead of Ni, Ti, Al, Mo, Cr, Pt, W, Si or TiC may be used or an alloy of these metals may be used.

Next, the drain electrode 41 is formed entirely on a back surface of the silicon carbide substrate 31. After that, in order to alloy the source-base common electrodes 40 and the drain electrodes 41 with the silicon carbide in contact with these electrodes, a heat treatment is performed on the silicon carbide member (31+32) at a temperature of 950° C. to 1000° C. and the rate of temperature rise of 10° C./sec to 25° C./sec for 20 to 60 seconds. This completes a principal part of device structure shown in FIG. 55.

In accordance with the third preferred embodiment, it is possible to manufacture the silicon carbide epitaxial channel MOSFET having a p base ohmic contact of sufficiently low resistance without decrease of the breakdown voltage of the MOSFET or increase of ON-resistance and without occurrence of process failure (for improvement in yield). Moreover, since the p++ region for p-type base contact 35 having the ohmic contact resistivity of sufficiently low resistance is completed, switching of MOSFET devices can be smoothly performed and it is thereby possible to reduce the power consumption. In addition, even if a high voltage such as a surge voltage is applied to the silicon carbide semiconductor device to cause the avalanche phenomenon, since the p++ region for p-type base contact 35 of low resistance and the contact electrode 40 which establishes ohmic contact with the region 35 serve as a path region to dissipate accumulated holes, it is possible to effectively avoid breakdown of electrical characteristics of the silicon carbide semiconductor device and achieve longer life of the silicon carbide semiconductor device.

In the silicon carbide semiconductor device of the third preferred embodiment, since the hole carrier concentration of the p-type silicon carbide region 35 is equal to or more than 5% of the impurity concentration of this region, the Hall mobility of the p-type silicon carbide region 35 is not higher than 4 $cm^2/Vs$ and the ohmic contact resistivity of the p-type silicon carbide region 35 is not higher than 8E-4 $\Omega cm^2$, it is possible to significantly reduce the ohmic contact resistivity as compared with the case where the p-type silicon carbide region is formed by performing the ion implantation at the implantation temperature over 300° C.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide semiconductor device having a silicon carbide layer, comprising the steps of:
   implanting Al ions having an implantation concentration in a range not lower than 1E19 $cm^{-3}$ and not higher than 1E21 $cm^{-3}$ from a main surface of said silicon carbide layer toward the inside of said silicon carbide layer while maintaining the temperature of said silicon carbide layer between 175° C. and 300° C., to form a p-type impurity layer;
   annealing the silicon carbide layer after the step of implanting the ions; and
   forming, on the main surface of the p-type impurity layer, a contact electrode having a back surface in ohmic contact with a front surface of said p-type impurity layer on said front surface of said p-type impurity layer, the contact electrode made of a material selected from the group consisting of Ni, Ti, Al, Mo, Cr, Pt, W, Si, and TiC.

2. The method of manufacturing a silicon carbide semiconductor device according to claim 1, wherein
   the temperature of said silicon carbide layer is maintained in a range not lower than 175° C. and not higher than 200° C. in said ion implantation step.

3. The method of manufacturing a silicon carbide semiconductor device according to claim 2, wherein said ion implantation step further comprises:
   implanting said ions while maintaining the temperature of said silicon carbide layer in the range not lower than 175° C. and not higher than 200° C., and said annealing step further comprises
   annealing said silicon carbide layer at the temperature in a range not lower than 1600° C. and not higher than 2000° C. after implantation of said ions.

4. The method of manufacturing a silicon carbide semiconductor device according to claim 1, wherein a hole carrier concentration of said p-type impurity layer is not lower than 5% of said implantation concentration.

5. The method of manufacturing a silicon carbide semiconductor device according to claim 1, wherein a Hall mobility of said p-type impurity layer is not higher than 4 $cm^2/Vs$.

6. The method of manufacturing a silicon carbide semiconductor device according to claim 1, wherein an ohmic contact resistivity of said p-type impurity layer is not higher than 8E-4 $S/cm^2$.

* * * * *